US007280183B2

(12) United States Patent
Fukui

(10) Patent No.: US 7,280,183 B2
(45) Date of Patent: *Oct. 9, 2007

(54) IMAGE FORMING DEVICE

(75) Inventor: Takashi Fukui, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 161 days.

This patent is subject to a terminal disclaimer.

(21) Appl. No.: 10/883,757

(22) Filed: Jul. 6, 2004

(65) Prior Publication Data

US 2005/0002006 A1   Jan. 6, 2005

(30) Foreign Application Priority Data

Jul. 3, 2003   (JP)   ............................ 2003-191118

(51) Int. Cl.
*G03B 27/42*   (2006.01)
*G03B 27/62*   (2006.01)

(52) U.S. Cl. .......................................... 355/53; 355/75
(58) Field of Classification Search .................. 355/53, 355/55, 58, 75; 310/10, 12; 356/401, 400, 356/399
See application file for complete search history.

(56) References Cited

U.S. PATENT DOCUMENTS 5,563,682 A * 10/1996 Aikawa et al. ............... 355/53

| 5,715,064 A * | 2/1998 | Lin ............................ 356/401 |
| 2003/0128350 A1* | 7/2003 | Tanaka ........................ 355/72 |
| 2003/0218730 A1* | 11/2003 | Murakami et al. ............ 355/53 |
| 2004/0032575 A1* | 2/2004 | Nishi et al. ................... 355/53 |
| 2005/0002005 A1* | 1/2005 | Terada et al. ................. 355/53 |

FOREIGN PATENT DOCUMENTS

JP   2000-338432 A   12/2000

* cited by examiner

*Primary Examiner*—Peter B. Kim
(74) *Attorney, Agent, or Firm*—Sughrue Mion, PLLC

(57) ABSTRACT

An image forming device in which, at a loading position, recording media are loaded onto stage members, and images are formed on the recording media while the stage members pass through an image forming section, and thereafter, the recording media are removed from the stage members at a removal position. In the image forming device, two traveling bodies, which move along predetermined paths between the loading position and the removal position, are provided in parallel. The stage members are mounted to the traveling bodies respectively so as to jut out from the traveling bodies. Each traveling body has a mechanism which moves the traveling body in vertical directions so that the stage members do not interfere with one another when they pass by one another. Image formation is carried out alternately on the recording media loaded on the respective stage members, and image forming processing can be carried out efficiently.

27 Claims, 19 Drawing Sheets

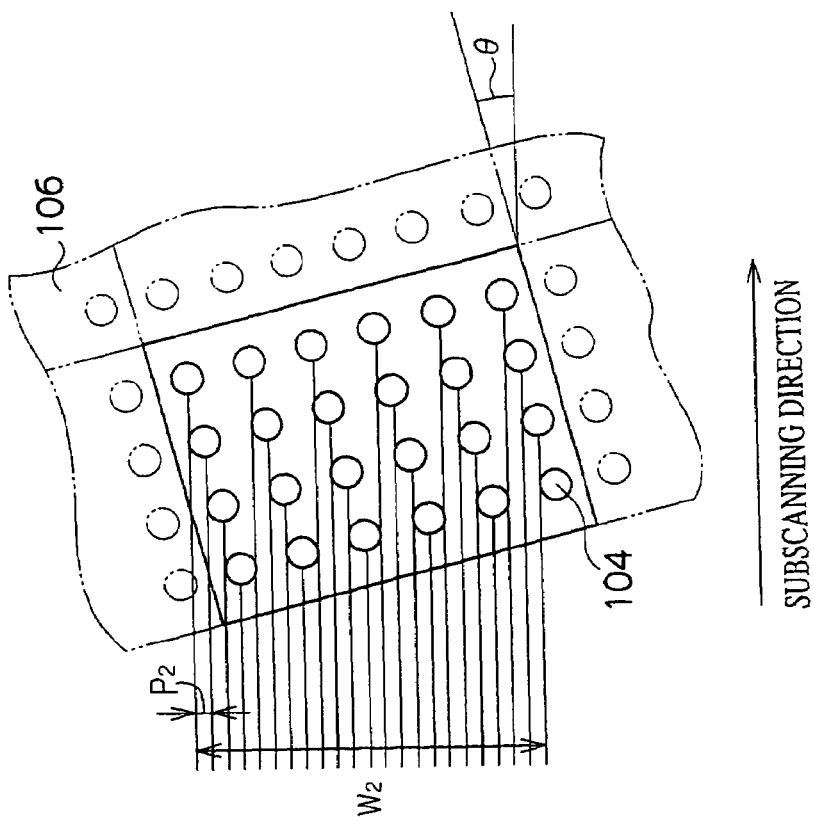
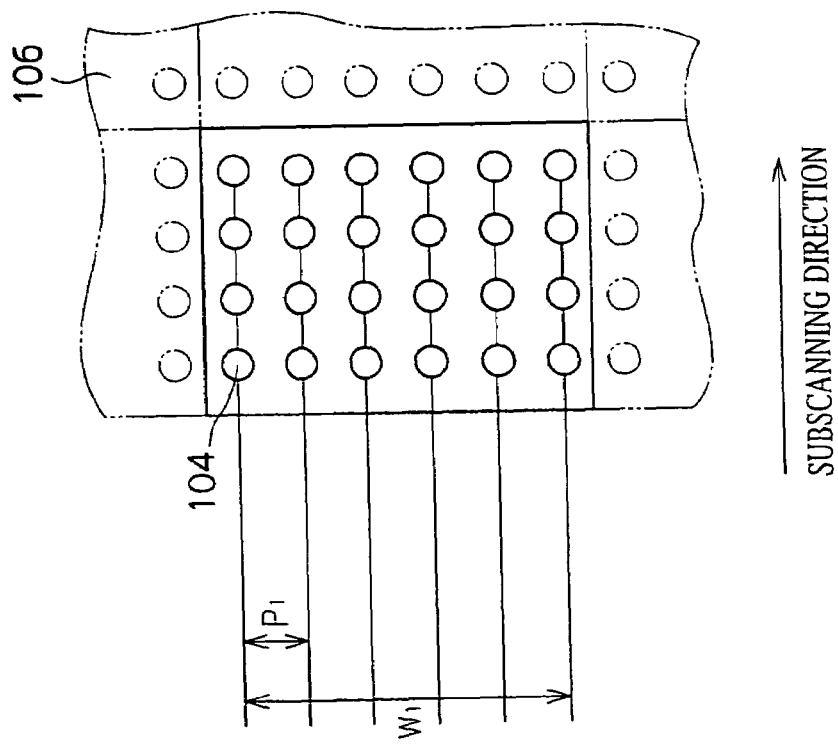

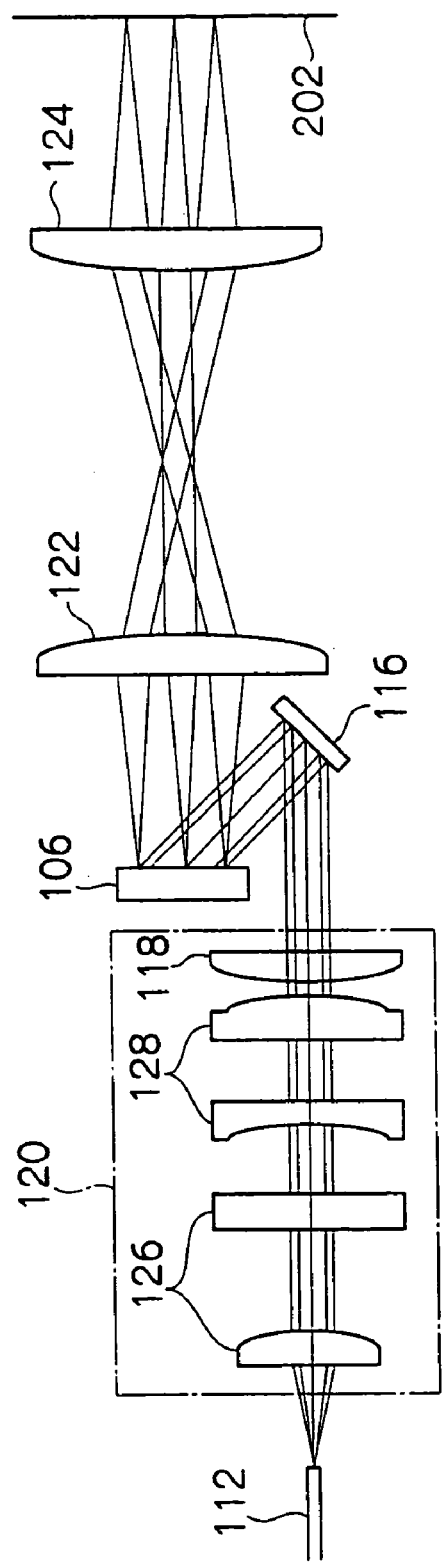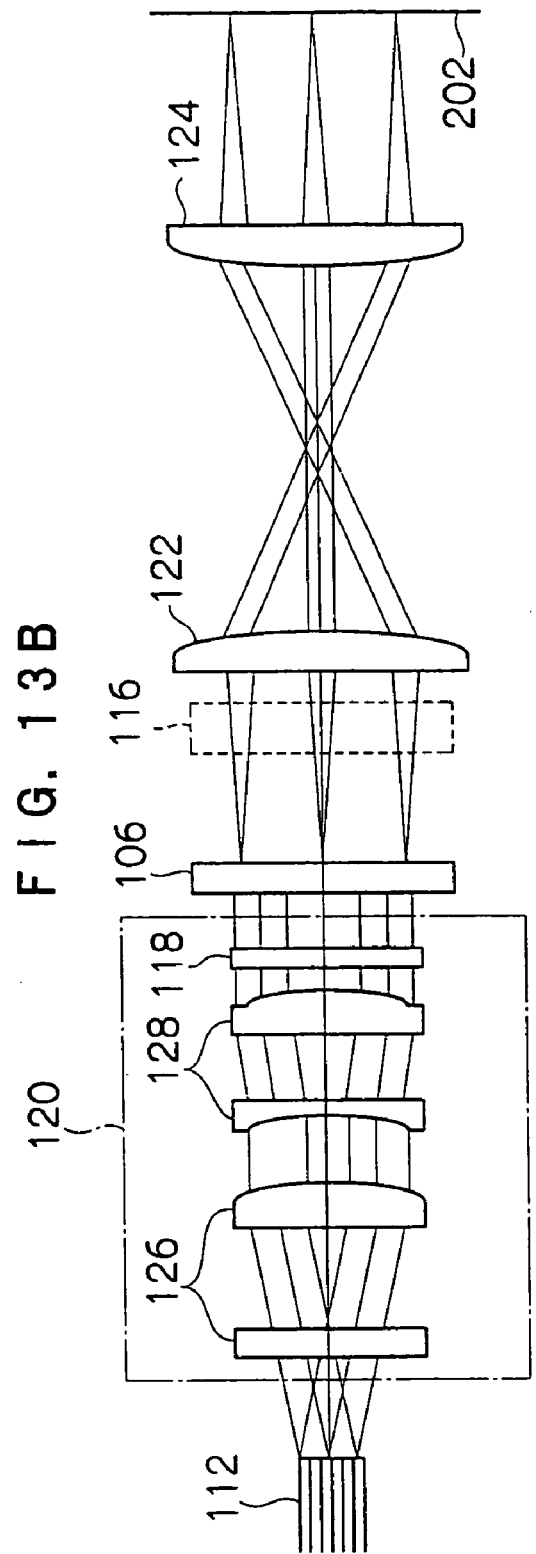

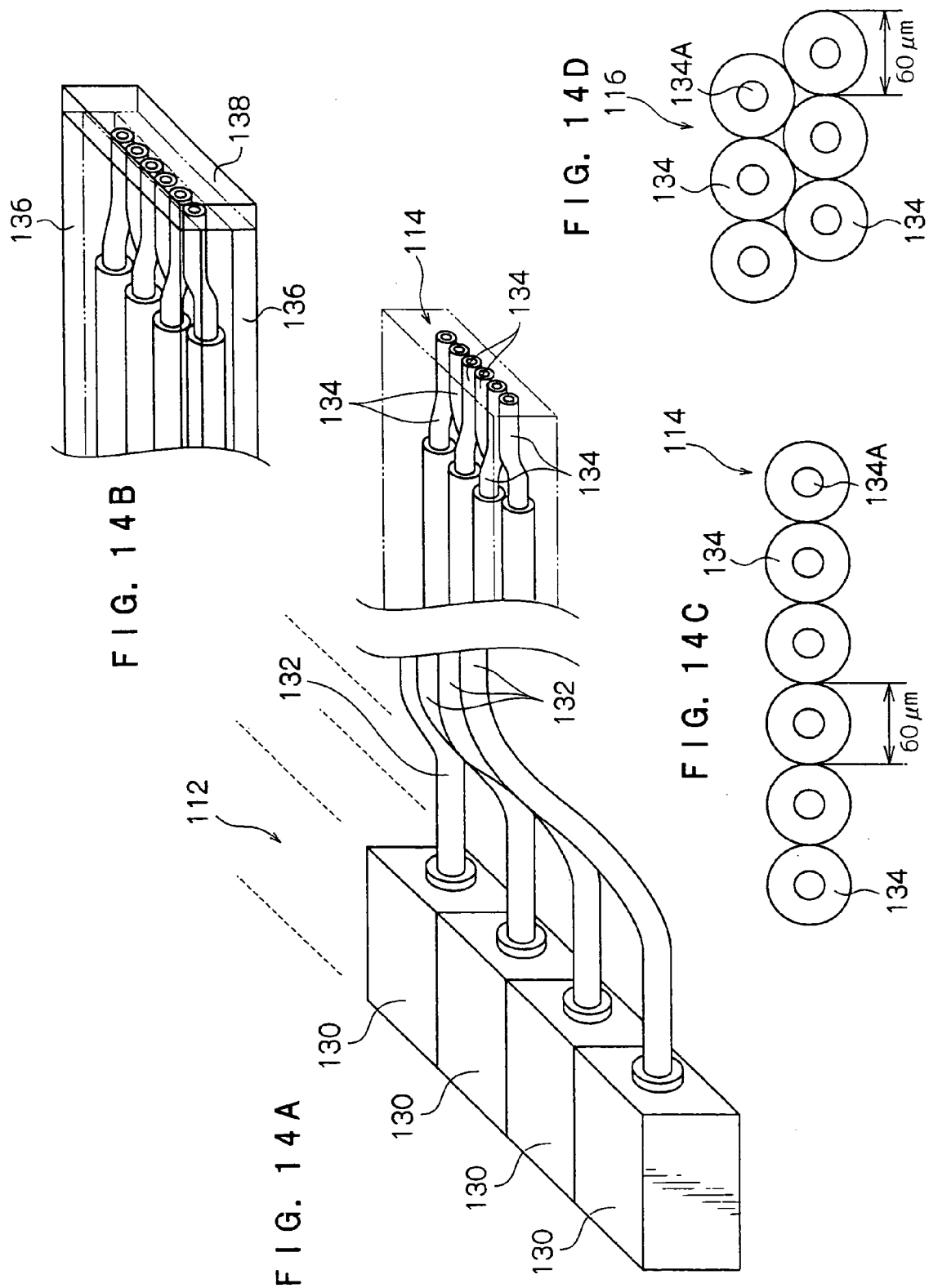

F I G. 1 5
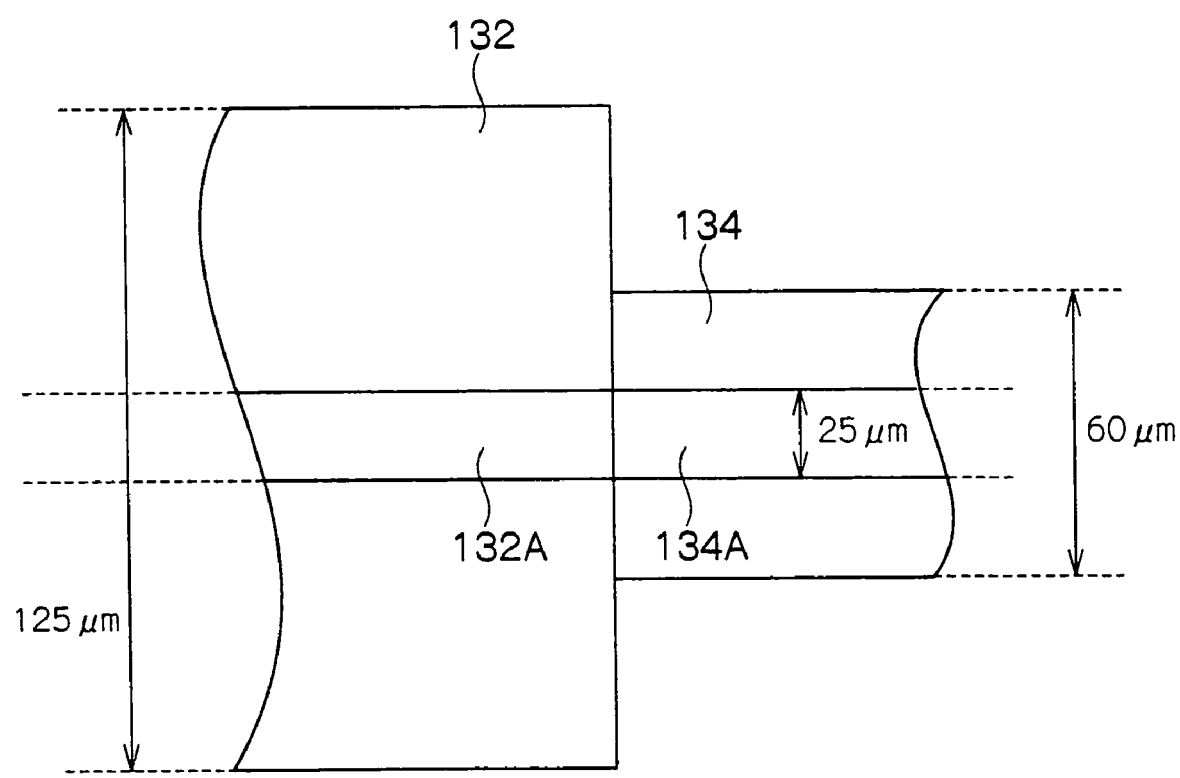

IMAGE FORMING DEVICE

CROSS-REFERENCE TO RELATED APPLICATION

This application claims priority under 35 USC 119 from Japanese Patent Application No. 2003-191118, the disclosure of which is incorporated by reference herein.

BACKGROUND OF THE INVENTION

1. Field of the Invention

The present invention relates to an image forming device used in, for example, an exposure device which exposes an image-drawing region on a recording medium such as a printed circuit board or the like by a light beam or the like modulated in accordance with image information, so as to form an image in the image-drawing region.

2. Description of the Related Art

Conventionally, laser exposure devices, which are used as image forming devices for forming wiring patterns on printed circuit boards or the like for example, have been structured such that a printed circuit board, which is the object of image exposure, is set (or "loaded", as will be used upon occasion) on a stage member for conveying, and while the stage member is moved at a predetermined speed in a subscanning direction, at a predetermined reading position, registration holes (alignment marks) provided at the four corners of the printed circuit board set on the stage member are picked-up by a CCD camera. Alignment processing for the image information is carried out by, in accordance with the position of the printed circuit board obtained by this image pickup, converting the coordinates of the region which is the object of image-drawing within the image-drawing coordinate system.

Then, at the predetermined exposure position, a laser beam, which is modulated on the basis of the image information and is deflected in the main scanning direction by a polygon mirror, scans and exposes a photosensitive coating film formed on the printed circuit board. In this way, exposure processing based on the image information is carried out, i.e., an image (latent image) corresponding to a wiring pattern is formed on a predetermined region (image-drawing region) of the printed circuit board. Note that the printed circuit board, on which the image (latent image) has been formed, is removed from the stage member (hereinafter called "unloading" upon occasion). The stage member, from which the printed circuit board has been removed, is moved to return to its initial position (is moved horizontally), and proceeds to the process for exposing the next printed circuit board (see, for example, Japanese Patent Application Laid-Open (JP-A) No. 2000-338432).

However, in this type of laser exposure device, exposure processing of printed circuit boards cannot be carried out during the time when the process of removing (unloading) the exposed printed circuit board from the stage member, the process of placing (loading) an unexposed printed circuit board on the stage member, and the process of moving the stage member to the reading position, are successively being carried out. Namely, the printed circuit board exposure processing is carried out intermittently at intervals corresponding to the aforementioned processes. Therefore, the manufacturing efficiency is poor. Thus, there has heretofore been the need to improve the manufacturing efficiency.

SUMMARY OF THE INVENTION

The present invention provides as image forming device which, while moving a recording medium along a predetermined conveying path, can efficiently carry out image forming processing for forming an image on the recording medium, and thereby improve the efficiency of manufacturing recording media on which images are formed.

A first aspect of the present invention is an image forming device forming, at a predetermined position between a loading position and a removal position, images on recording media which are conveyed from the loading position, at which the image forming device receives the recording medium, to the removal position, at which the image recording medium is removed to a subsequent process, the image forming device comprising: two traveling bodies moving reciprocatingly between the loading position and the removal position; stage members on which the recording media are loaded, each stage member being mounted to a corresponding traveling body; and an interference preventing mechanism for avoiding interference between the stage members when the two traveling bodies move so as to approach one another. The loading position and the removal position are fixed positions. The interference preventing mechanism may include a stage member moving mechanism which moves at least one of the stage members on the traveling body to which that stage member is mounted. The two traveling bodies may move along different conveying paths which extend parallel to one another and connect the loading position and the removal position, and each stage member may have a portion which juts out further than the corresponding traveling body. The portion of each stage member which juts out further than the corresponding traveling body passes through a common region at a time of image formation.

A second aspect of the present invention is an image forming device in which recording media are loaded onto stage members at a loading position, and images are formed on the recording media while the stage members pass through an image forming section, and the recording media on which the images have been formed are removed from the stage members at a removal position. Two traveling bodies which move along conveying paths which connect the loading position and the removal position are provided parallel to one another and so as to be able to approach one another and then move away from one another. Each of the stage members is mounted to a corresponding traveling body so as to jut out from the corresponding traveling body. An interference preventing mechanism is provided so that the stage members do not interfere with one another when the stage members pass by one another.

In the above-described second aspect, the two traveling bodies, which move between the loading position and the removal position of the recording media, are provided parallel to one another and so as to be able to approach one another and then move away from one another. Each of the stage members is mounted to a corresponding traveling body so as to jut out therefrom. Owing to an interference preventing mechanism, the stage members do not interfere with one another when the stage members pass by one another. Accordingly, during the time when, for example, one of the stage members carries a recording medium and moves from the loading position to the removal position (i.e., during the time when an image is formed on the recording medium), the other stage member from which a recording medium has been removed can move from the removal position to the loading position, and a recording medium can be loaded onto this other stage member. Namely, image formation processing can be carried out continuously. Therefore, as compared with a structure in which images are formed by a single stage member moving reciprocatingly in the same plane such as in a conventional image forming device, the efficiency of image formation processing can be greatly improved.

Further, in the image forming device of the above-described aspect, the interference preventing mechanism may be a moving mechanism which makes the stage members approach and move away from the image forming section.

In the invention of the above-described aspect, the interference preventing mechanism is a moving mechanism which makes the stage members approach and move away from the image forming section. Therefore, when the two traveling bodies approach one another and then move away from one another, i.e., when the stage members pass by one another, one of the stage member is made to approach the image forming section, whereas the other stage member is moved away from the image forming section. It is thereby possible for the other stage member to not interfere with the one stage member.

Further, the moving mechanism may adjust the moving amounts of the stage members such that the distance between the image forming section and the recording surface of the recording medium is constant regardless of the thickness of the recording medium.

In this case, the moving amounts of the stage members can be adjusted. Therefore, there is no need to carry out focal length adjustment to change the position of the image forming section with respect to the recording surface, for each recording medium having a different thickness.

Moreover, in the image forming device of the above-described aspect, the loading position and the removal position may be disposed at substantially the same position. If the loading position and the removal position are disposed at substantially the same position, space can be conserved in setting the image forming device. Moreover, this structure is particularly convenient in a case in which the recording media are loaded manually onto the stage members.

An image forming device relating to a third aspect of the present invention has: an image forming section for forming an image on a recording medium; two stage members on which the recording media are loaded, and which are for conveying the recording media to the image forming section; and two moving mechanisms provided for the stage members respectively, and reciprocatingly moving at least stage surfaces of the stage members on substantially the same locus, between a loading position at which the recording medium is loaded on the stage member, and an image forming position at which an image is formed on the recording medium loaded on the stage member, and a removal position at which the recording medium is removed from the stage member, wherein each of the moving mechanisms has individual rails for moving which support the stage members respectively. In the image forming device of the third aspect, the two moving mechanisms, which move at least the stage surfaces of the stage members reciprocatingly on substantially the same locus, have individual rails for moving. Therefore, each stage member can be moved stably and precisely.

The image forming device relating to the third aspect may have a control section for controlling the two moving mechanisms independently. Because the control section controls the two moving mechanisms independently, even if there is trouble with one, the other is not affected. Namely, even if there is trouble with one, the other can be operated. Therefore, images can continuously be formed onto the recording media.

Further, the two stage members may be disposed so as to have plane symmetry with respect to one another, and the two moving mechanisms may be disposed so as to have plane symmetry with respect to one another. If the two stage members and the two moving mechanisms are disposed so as to have plane symmetry with respect to one another respectively, in the image forming device overall, the balance in the left-right direction (the transverse direction) is good, and the stage members can be moved stably.

Each of the moving mechanisms may have a parallel moving portion moving the stage member in a direction parallel to the stage surface of the stage member, and a perpendicular moving portion moving the stage member in a direction perpendicular to the stage surface of the stage member, such that the stage members are suitably supported.

Moreover, in the image forming device of the above-described aspect, the parallel moving portions of the moving mechanisms may be disposed so as to be lined up, and the stage surfaces of the stage members may be disposed so as to be superposed above the two parallel moving portions as seen in plan view. In accordance with such a structure, the image forming device itself can be made compact. Namely, space can be conserved in setting the image forming device.

BRIEF DESCRIPTION OF THE DRAWINGS

FIG. 11A is a schematic plan view showing scan lines of exposure beams in a case in which the DMD is not disposed at an incline, and FIG. 11B is a schematic plan view showing scan lines of exposure beams in a case in which the DMD is disposed at an incline.

FIG. 13A is a schematic sectional view of a subscanning direction along an optical axis, showing the structure of the exposure head, and FIG. 13B is a schematic side view of the exposure head of FIG. 13A.

FIG. 14A is a schematic perspective view showing the structure of a fiber array light source, FIG. 14B is a partial enlarged diagram showing the fiber array light source of FIG. 14A, FIG. 14C is a diagram for explanation showing the arrangement of light-emitting points at a laser exiting portion, and FIG. 14D is a diagram for explanation showing the arrangement of light-emitting points at the laser exiting portion.

FIG. 15 is a diagram for explanation showing the structure of a multi-mode optical fiber.

DETAILED DESCRIPTION OF THE INVENTION

Figure 1:
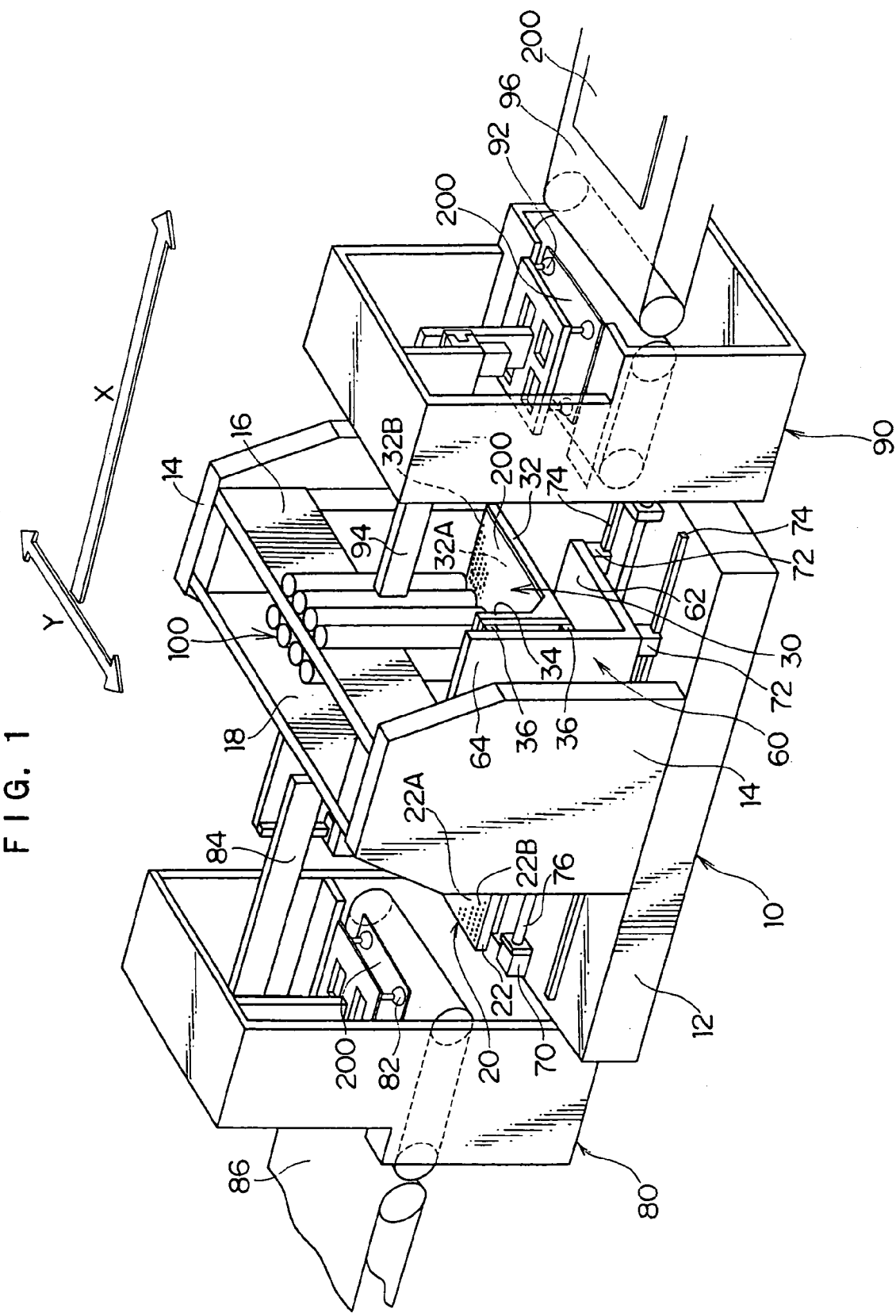
FIG. 1 is a schematic perspective view showing a laser exposure device, a loader and an unloader relating to the present invention.
Figure 2:
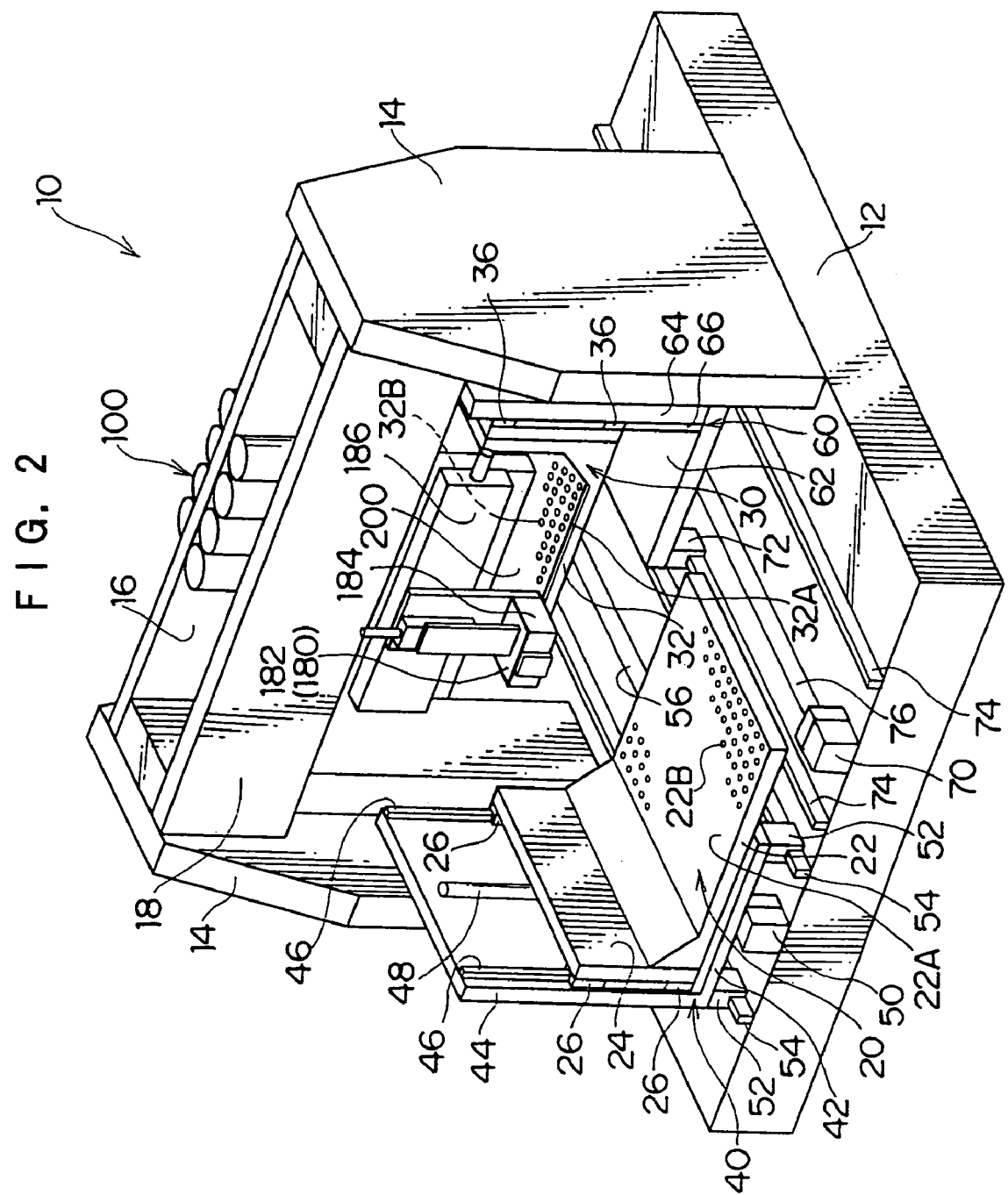
FIG. 2 is a schematic perspective view showing the structure of the laser exposure device relating to the present invention.
Figure 3:
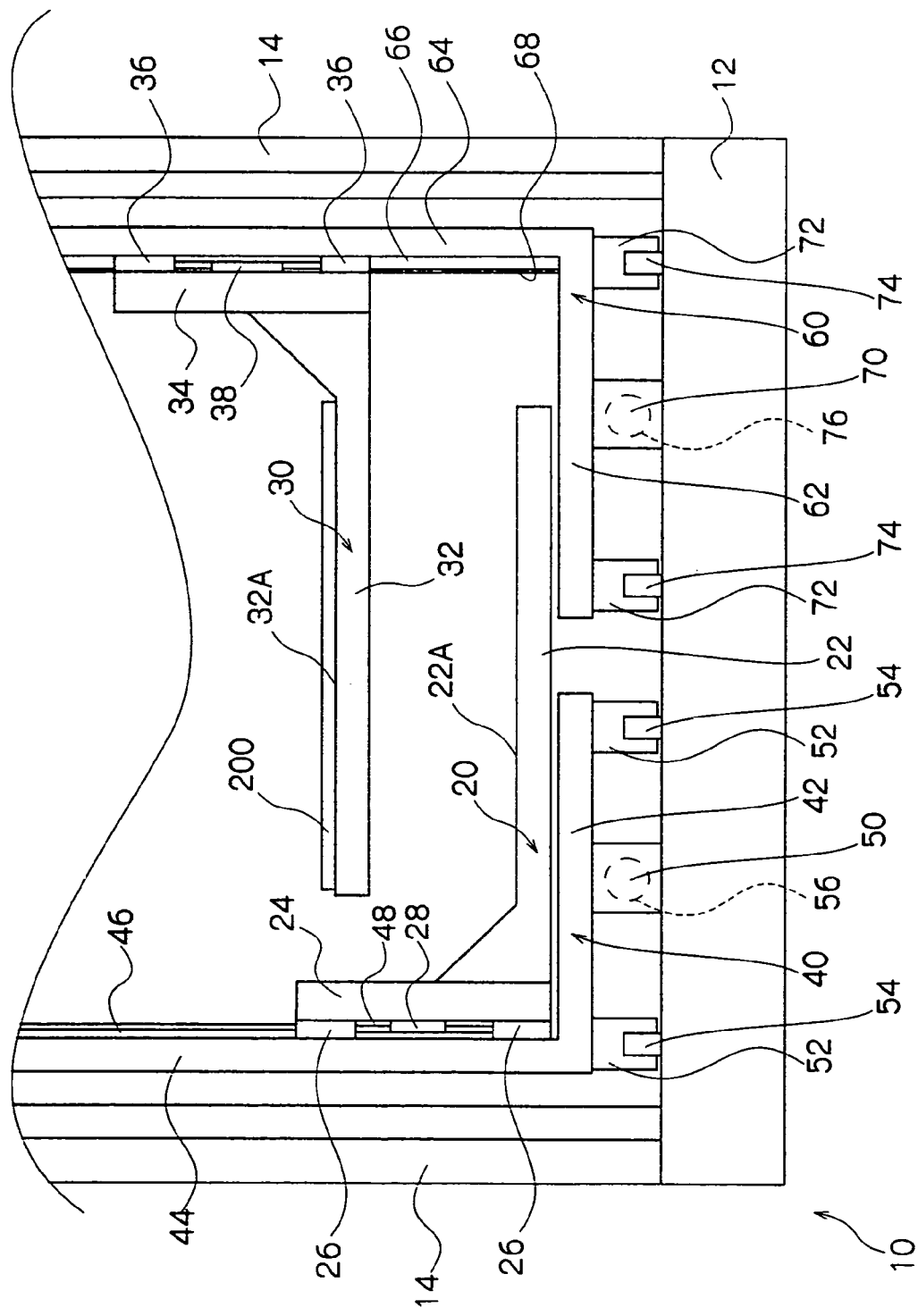
FIG. 3 is a schematic front view of main portions showing the structure of the laser exposure device relating to the present invention.

Hereinafter, an embodiment of the present invention will be described in detail on the basis of the drawings. FIG. 1 is a schematic perspective view showing a laser exposure device, which is one example of the image forming device relating to the present invention, and a loader which supplies substrate materials and an unloader which discharges substrate materials. FIG. 2 is a schematic perspective view of the laser exposure device. A laser exposure device 10 relating to the present invention, while conveying, at a predetermined speed, a thin, plate-shaped substrate material 200 which is the material for a printed circuit board, exposes the substrate material 200 by a laser beam B which is modulated in accordance with image information, so as to form an image (a latent image) corresponding to a wiring pattern on the substrate material 200.

Here, for convenience of explanation, the direction shown by arrow X in FIG. 1 will be referred to as the "conveying direction" of the substrate material 200, and the "upstream side" and "downstream side" are expressed on the basis thereof. Further, the direction opposite thereto will be referred to as the "returning direction" of the substrate material 200. The direction orthogonal to the direction of arrow X is denoted by arrow Y, and is the "transverse direction" in the laser exposure device 10.

[Summary of Exposure Device]

First, a summary of the laser exposure device 10 relating to the present invention will be described. As shown in FIGS. 1 and 2, the laser exposure device 10 has two stage members which have a predetermined thickness, are substantially L-shaped as seen in side view, and move in the conveying direction while sucking and holding the substrate materials 200 to the surfaces (top surfaces) thereof. Two stage members 20, 30 have the same structure, and for convenience of explanation, the stage member at the left side when facing in the conveying direction is the stage member 20, and the stage member at the right side is the stage member 30. Further, upon occasion, explanation will be given with the substrate material 200 which is sucked to and held on the stage member 20 being referred to as substrate material 200A, and the substrate material 200 which is sucked to and held on the stage member 30 being referred to as substrate material 200B.

The stage members 20, 30 are respectively supported in a cantilevered manner so as to be able to freely rise and fall, by linear traveling bodies 40, 60 serving as moving mechanisms (conveying means). The linear traveling bodies 40, 60 are supported adjacent to one another so as to be movable in the conveying direction and the returning direction, such that the stage members 20, 30 reach the inner sides thereof. Accordingly, for example, the one stage member 20 is raised to its upper position and the other stage member 30 is lowered to its lower position, so that the stage members 20, 30 which are at the inner sides do not interfere with one another when the linear traveling bodies 40, 60 pass by one another. Namely, at its upper position, each stage member 20, 30 moves in the conveying direction, and the substrate material 200 sucked and held thereto is exposed, and after the substrate material 200 has been removed therefrom, the stage member 20, 30 moves in the returning direction at its lower position so as to return to its initial position (the loading position at which the substrate material 200 is loaded thereon).

The linear traveling bodies 40, 60 are movably supported on a base 12. A pair of side walls 14 stand erect at the conveying direction both sides of the base 12. A gate 18, to which is mounted a CCD camera 182 structuring an image position detecting device 180, spans in the transverse direction between the top portions of the side walls 14. Further, a gate 16, to which are mounted a plurality of exposure heads 100, spans in the transverse direction between the top portions of the downstream sides of the side walls 14, so as to be positioned a predetermined interval away from the gate 18.

The exposure heads 100 are fixed in downward-facing state, so as to be able to irradiate laser beams B toward the substrate material 200 passing by the gate 16. The CCD camera 182 is provided so as to be able to freely move reciprocatingly in the transverse direction, in a state of facing downward so as to be able to pick-up alignment marks 203 (see FIG. 7) for detecting of the position (the image-drawing region) of the substrate material 200 passing by the gate 18.

Accordingly, the laser exposure device 10 mainly operates as follows. First, the substrate material 200A is placed by a loader (substrate supplying device) 80 on a placement surface 22A of the stage member 20. Then, while the substrate material 200A is conveyed in a state of being sucked to and held on the placement surface 22A, the alignment marks 203 thereof are picked-up by the CCD camera 182 such that the position (the image-drawing region) thereof is detected. On the basis of the results of detection, the predetermined image-drawing region is exposed by the exposure heads 100. When exposure is completed, the substrate material (printed circuit board) 200A is removed from the stage member 20 by an unloader (substrate removing device) 90.

On the other hand, at this time, the stage member 30 is already conveying the subsequent substrate material 200B in a state in which the substrate material 200B is sucked to and held on a placement surface 32A of the stage member 30. The position is detected by the CCD camera 182, and exposure is started. Namely, during the time while the substrate material 200A on the stage member 20 is being exposed, the stage member 30, from which a substrate material (printed circuit board) has previously been unloaded, is moved beneath the stage member 20 so as to return to its initial position (loading position). The subsequent substrate material 200B is loaded thereon, and the stage member 30 proceeds to the process of position detection by the CCD camera 182.

In this way, the laser exposure device 10 is structured such that exposure of the substrate materials 200 is carried out successively without pause, by alternately circulating the stage members 20, 30. The operation rate of the exposure heads 100, i.e., the efficiency of manufacturing printed circuit boards, is improved. The above has been a summary of the laser exposure device 10, and the structures of the respective sections thereof will be described in detail hereinafter.

[Structure of Exposure Heads]

First, the structure of the exposure heads 100 will be described in detail on the basis of FIGS. 7 through 19. As described above, the exposure heads 100 are suspended from the top portion of the gate 16 which spans across the transverse direction of the laser exposure device 10. When the substrate material 200, which is conveyed in while being sucked to and held on the stage member 20, passes by the exposure position directly therebeneath, the exposure heads 100 illuminate the laser beams B, which have been modulated on the basis of image information, from above so as to expose an exposure surface 202 of the substrate material 200, and form an image (a latent image) corresponding to a wiring pattern of a printed circuit board on the exposure surface 202.

Here, the top surface portion of the substrate material 200 is the exposure surface 202 which is a thin-film-like photosensitive coated film formed by a photosensitive material. After the latent image (image) is formed on the exposure surface 202, the exposure surface 202 is subjected to a predetermined processing such as etching or the like so that a wiring pattern corresponding to the latent image is formed thereon. Note that the photosensitive thin film is either formed by applying a liquid photosensitive material onto the substrate material 200 and drying and curing it, or by laminating a photosensitive material which has been formed as a film in advance.

Figure 7:
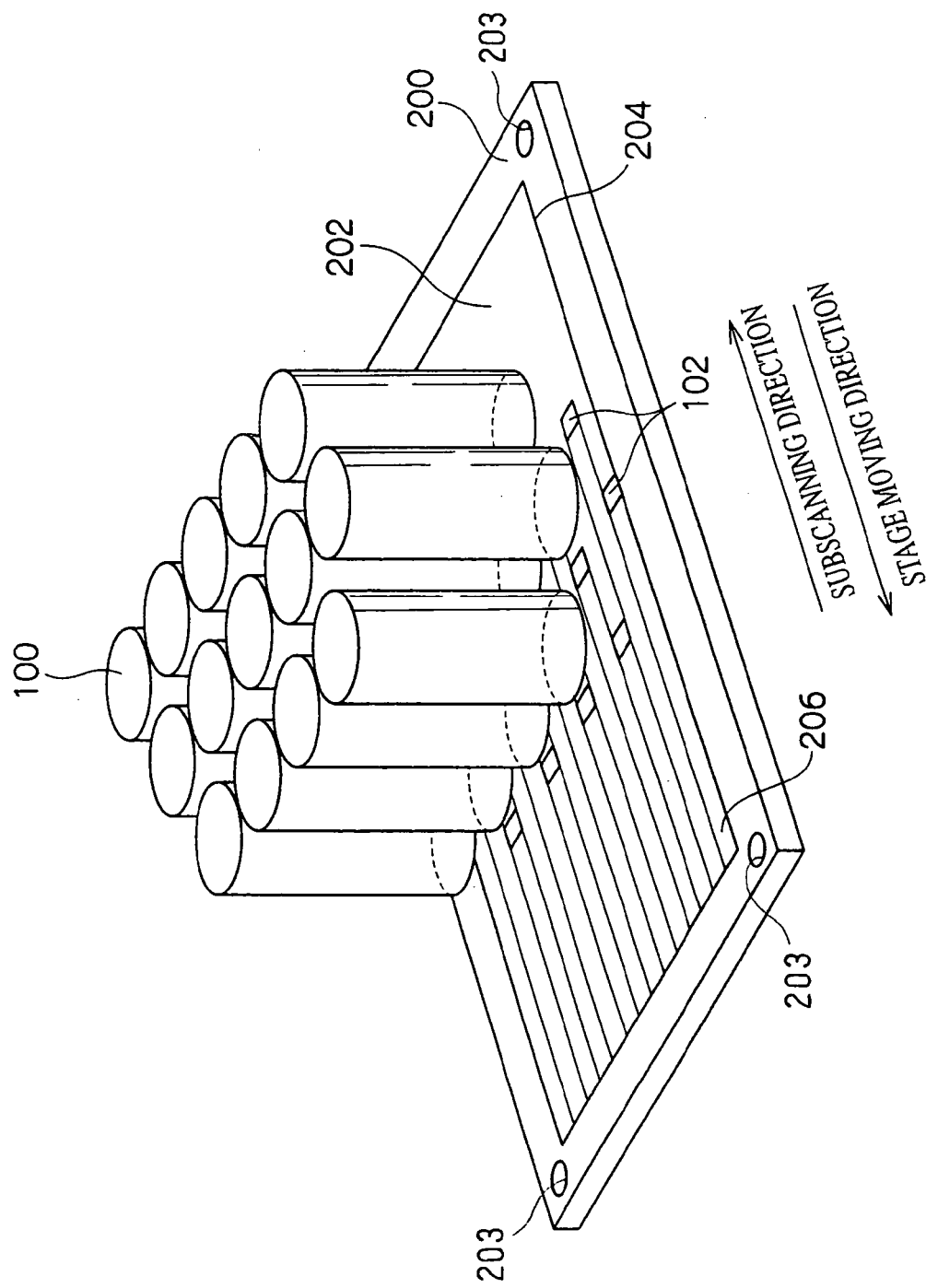
FIG. 7 is a schematic perspective view showing an exposure head.
Figure 8A:
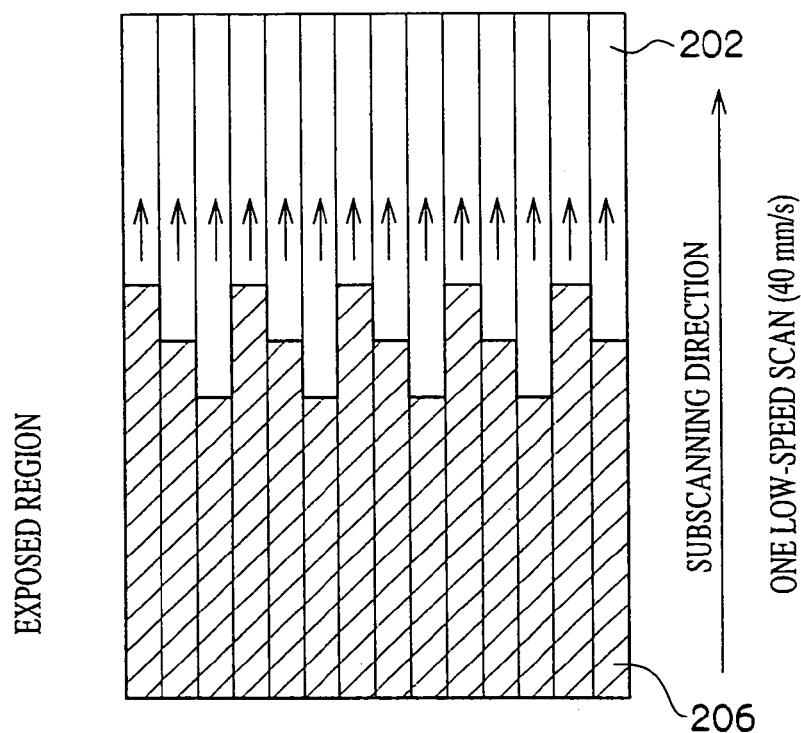
FIG. 8A is a diagram for explaining exposed regions formed on a substrate material.
Figure 8B:
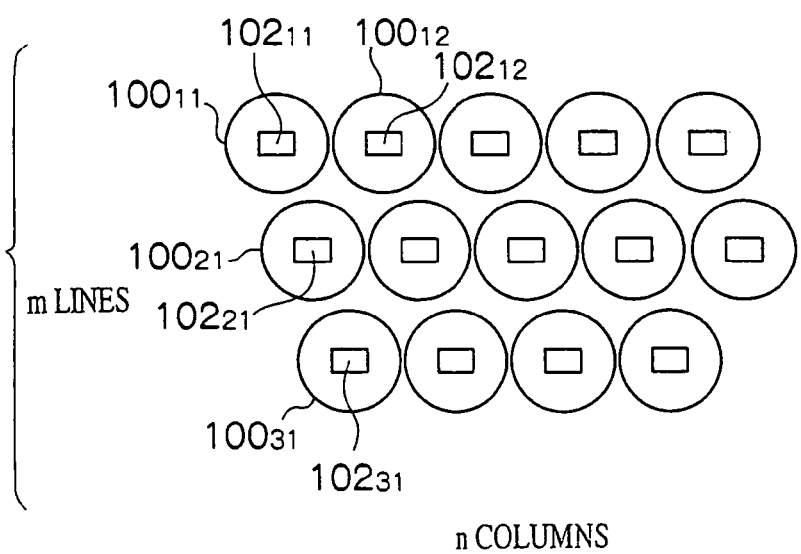
FIG. 8B is a diagram for explaining the arrangement of exposure areas by exposure heads.

As shown in FIGS. 7 and 8, a plurality (e.g., 14) of the exposure heads 100 are arranged in a substantial matrix form of m lines and n columns (e.g., three lines and five columns). In the illustrated structure, four of the exposure heads 100 are disposed in the third line, due to the relation with the width of the substrate material 200. Hereinafter, when the individual exposure head of the mth line and nth column is referred to, it will be called exposure head 100 mn.

An exposure area 102 of the exposure head 100 is in the shape of a rectangle whose short side runs along the subscanning direction. Accordingly, due to the stage member 20 moving in the conveying direction (the exposure heads 100 moving relatively in the subscanning direction), a strip-shaped exposed region 206 is successively formed by each exposure head 100 on an image-drawing region 204 on the exposure surface 202 of the substrate material 200. Note that, hereinafter, when the individual exposure area 102 of the exposure head 100 of the mth line and nth column is referred to, it will be called exposure area 102 mn.

As shown in FIG. 8, the exposure heads 100 of each line, which are arranged in the form of a row, are disposed so as to be offset by a predetermined interval in the lined-up direction (a natural number multiple of the long side of the exposure area (a multiple of two in the present embodiment)), so that the strip-shaped exposed regions 206 are lined-up, without intervals therebetween, in the direction orthogonal to the subscanning direction (i.e., in the main scanning direction). Therefore, the portion which cannot be exposed between the exposure area $102_{11}$ and the exposure area $102_{12}$ of the first line can be exposed by the exposure area $102_{21}$ of the second line and the exposure area $102_{31}$ of the third line.

Figure 9:
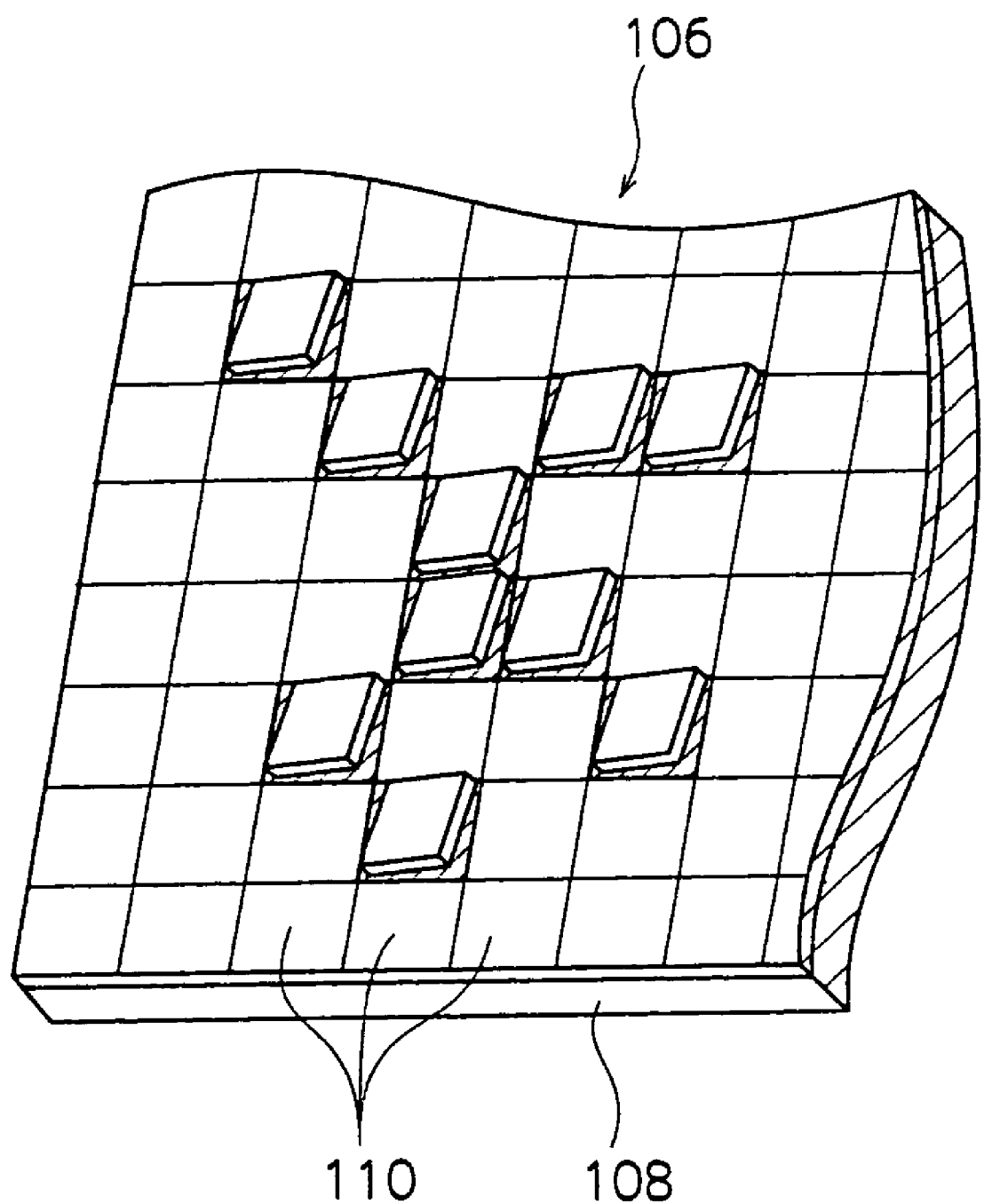
FIG. 9 is a partial enlarged diagram showing the structure of a digital micromirror device (DMD).

As shown in FIG. 9, each of the exposure heads $100_{11}$ through 100 mn has a digital micromirror device (hereinafter called "DMD") 106 which serves as a spatial light modulator and which modulates the incident light beam on a pixel-by-pixel basis in accordance with image information. As shown in the figure, the DMD 106 is an integrally structured mirror device in which a large number (e.g., 600×800) of extremely small mirrors (hereinafter called "micromirrors") 110 which form pixels are arranged in the form of a grid on an SRAM cell (a memory cell) 108. A material having high reflectivity, such as aluminum or the like, is deposited on the surface of the micromirror 110 such that the reflectivity is 90% or more. Each micromirror 110 is supported by a support (not illustrated) including a hinge and a yoke.

Figure 10A:
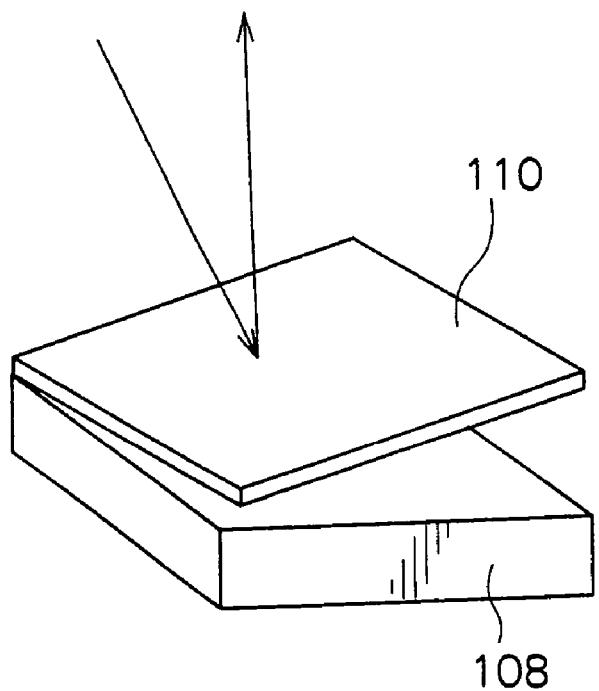
FIG. 10A is a diagram for explanation of operation of the DMD.
Figure 10B:
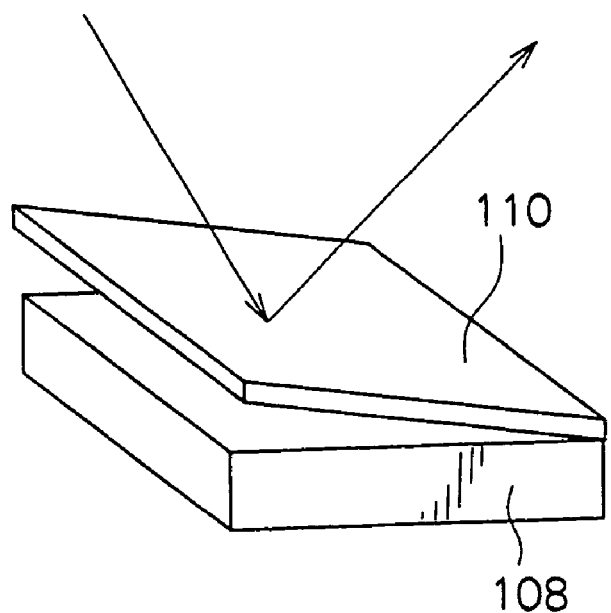
FIG. 10B is another diagram for explanation of the operation of the DMD.

Accordingly, when a digital signal is written to the SRAM cell 108 of the DMD 106, the micromirrors 110, which are supported by the supports, are tilted, around diagonal lines, within a range of ±α° (e.g., ±10°) with respect to the base on which the DMD 106 is disposed. Namely, due to the tilting of the micromirrors 110 of the DMD 106 being controlled in accordance with the image signal, the light incident on the DMD 106 is reflected in the directions of tilting of the respective micromirrors 110. FIG. 10A illustrates a state in which the micromirror 110 is tilted by +α° which is the on state. FIG. 10B illustrates a state in which the micromirror 110 is tilted by −α° which is the off state. A light absorbing body (not shown) is disposed in the direction in which the light beams are reflected by the micromirrors 110 which are in their off states.

Further, as described above, the DMD 106 is structured such that a large number of groups (e.g., 600 groups) of micromirror rows, in each of which a large number (e.g., 800) of the micromirrors 110 is lined-up in the longitudinal direction, are arranged in the direction of the shorter side. Further, the DMD 106 is inclined slightly such that the shorter side thereof forms a predetermined angle θ (e.g., 1° to 5°) with the subscanning direction. FIG. 11A shows the loci of scanning of reflected light images (exposure beams) 104 by the micromirrors 110 in a case in which the DMD 106 is not inclined. FIG. 11B shows the loci of scanning of the reflected light images (exposure beams) 104 in a case in which the DMD 106 is inclined by the predetermined angle θ. In this way, when the DMD 106 is inclined, a pitch $P_2$ of the loci of scanning of the exposure beams by the micromirrors 110 (i.e., the pitch $P_2$ of the scan lines) can be set to be more narrow than a pitch $P_1$ of the scan lines in a case in which the DMD 106 is not inclined. Therefore, the resolution can be greatly improved.

Moreover, because the same scan lines are exposed overlappingly (multiple-exposed) by different micromirror lines, extremely small amounts of the exposure position can be controlled, and extremely fine exposure can be realized. Accordingly, the junctures between the plural exposure heads 100 which are lined-up in the main scanning direction can be connected without spaces therebetween by controlling the exposure position in extremely fine amounts. Note that, because the angle of inclination θ of the DMD 106 is extremely small, a scanning width $W_2$ in a case in which the DMD 106 is inclined and a scanning width $W_1$ in a case in which the DMD 106 is not inclined are substantially equal. Further, it goes without saying that similar effects can be achieved if, instead of tilting the DMD 106, the respective lines of micromirrors are disposed in a staggered form so as to be offset by predetermined intervals in the direction orthogonal to the subscanning direction.

An unillustrated image information processing section and mirror driving controlling section are built-into the control device (not shown) which drives and controls the exposure heads 100. A control signal, which drives and controls each micromirror 110 within a region to be controlled of the DMD 106 for each exposure head 100, is generated in the image information processing section on the basis of image information corresponding to the wiring pattern inputted from the controller (not illustrated) which controls the laser exposure device 10 overall. In the mirror driving controlling section, for each of the exposure heads 100, the angle of each micromirror 110 of the DMD 106 is controlled to be set in an on state or an off state on the basis of the control signal generated at the image information processing section.

Figure 12:
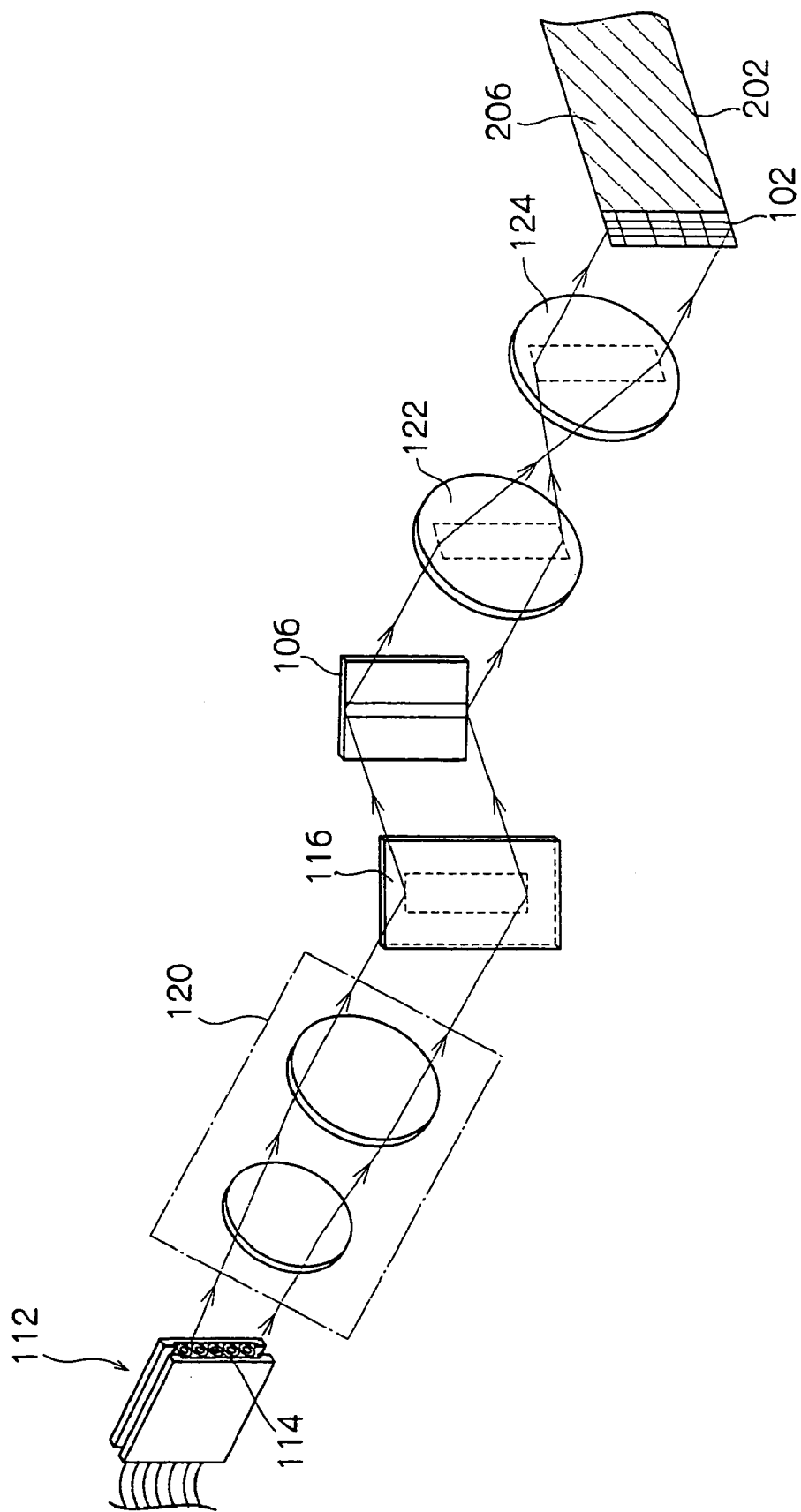
FIG. 12 is a schematic perspective view showing the structure of an exposure head.

As shown in FIG. 12, a fiber array light source 112, a lens system 120, and a mirror 116 are disposed in that order at the light incident side of the DMD 106. The fiber array light source 112 has a laser exiting portion 114 at which the light exiting end portions (light-emitting points) of optical fibers are lined up in one row along a direction corresponding to the direction of the long sides of the exposure areas 102. The lens system 120 corrects the laser light exiting from the fiber array light source 112, and collects it on the DMD 106. The mirror 116 reflects the laser light, which has passed through the lens system 120, toward the DMD 106. Lens systems 122, 124 are disposed at the light reflecting side of the DMD 106. The lens systems 122, 124 focus the laser light, which has been reflected at the DMD 106, onto the exposure surface 202 of the substrate material 200. The lens systems 122, 124 are disposed such that the DMD 106 and the exposure surface 202 are set in a conjugate relationship.

As shown in FIG. 13, the lens system 120 is structured by a pair of combination lenses 126, a pair of combination lenses 128, and a condenser lens 118. The pair of combination lenses 126 make the laser light exiting from the fiber array light source 112 into parallel ray. The pair of combination lenses 128 carry out correction such that the light amount distribution of the laser light which has been made into parallel ray is uniform. The condenser lens 118 collects the laser light, whose light amount distribution has been corrected, on the DMD 106. The combination lenses 128 have the following functions: with regard to the direction in which the laser exiting ends are lined up, the portions of the combination lenses 128 near to the optical axes of the lenses widen the luminous flux, and the portions away from the optical axes narrow the luminous flux, whereas, with regard to the direction orthogonal to the lined-up direction, the combination lenses 128 make the light pass through as is. The combination lenses 128 correct the laser light such that the light amount distribution thereof becomes uniform.

As shown in FIG. 14A, the fiber array light source 112 has a plurality (e.g., six) laser modules 130. One end of a multi-mode optical fiber 132 is connected to each of the laser modules 130. Optical fibers 134 are connected to the other ends of the multi-mode optical fibers 132. The core diameter of the optical fiber 134 is the same as that of the multi-mode optical fiber 132, and the clad diameter of the optical fiber 134 is smaller than that of the multi-mode optical fiber 132. As shown in FIG. 14C, the laser exiting portion 114 is structured by the light exiting end portions (the light-emitting points) of the optical fibers 134 being lined-up in one row along the main scanning direction which is orthogonal to the subscanning direction. Note that, as shown in FIG. 14D, the light exiting end portions (the light-emitting points) of the optical fibers 134 may be lined-up in two rows along the main scanning direction.

As shown in FIG. 14B, the light exiting end portions of the optical fibers 134 are nipped and fixed between two supporting plates 136 whose surfaces are flat. Further, a protective plate 138, which is transparent and made of glass or the like, is disposed at the light exiting side of the optical fibers 134 so as to protect the end surfaces of the optical fibers 134. The protective plate 138 may be disposed so as to fit tightly to the end surfaces of the optical fibers 134, or may be disposed such that the end surfaces of the optical fibers 134 are sealed. At the light exiting end portions of the optical fibers 134, the light density is high, and it is easy for dust to accumulate thereat, and it is easy for this region to deteriorate. However, by providing the protective plate 138, the adhering of dust or the like to the end surfaces can be prevented, and deterioration can be retarded.

As shown in FIG. 14B, in order for the light exiting ends of the optical fibers 134, whose clad diameters are small, to be lined-up in one row without any gaps therebetween, the multi-mode optical fiber 132 is stacked on top between two of the multi-mode optical fibers 132 which are adjacent to each other at the portions where the clad diameters thereof are large. The light exiting end of the optical fiber 134, which is joined together with the multi-mode optical fiber 132 which is stacked on top, is disposed so as to be nipped between the light exiting ends of the two optical fibers 134 which are joined to the two multi-node optical fibers 132 which are adjacent to each other at the portions where the clad diameters thereof are large. This can be achieved by coaxially joining a length of 1 to 30 cm of the optical fiber 134 whose clad diameter is small to the distal end portion of the laser light-emitting side of the multi-mode optical fiber 132 whose clad diameter is large, e.g., by fusing the light incident end surface of the optical fiber 134 to the light exiting end surface of the multi-mode optical fiber 132 such that the central axes thereof coincide.

Note that any of a step-index optical fiber, a graded-index optical fiber, and a composite optical fiber can be used as the multi-mode optical fiber 132 and the optical fiber 134. As shown in FIG. 15, the diameter of a core 134A of the optical fiber 134 is the same size as the diameter of a core 132A of the multi-node optical fiber 132. Namely, the clad diameter of the optical fiber 134 is 60 μm and the core diameter thereof is 25 μm, whereas the clad diameter of the multi-node optical fiber 132 is 125 μm and the core diameter thereof is 25 μm. Further, the transmittance of the light incident end surface coating of the multi-mode optical fiber 132 is 99.5% or more.

Further, although not illustrated, a short optical fiber, in which an optical fiber whose clad diameter is small is fused to an optical fiber which is short and whose clad diameter is large, may be joined to the light exiting end of the multi-mode optical fiber 132 via a ferrule or an optical connector or the like. In this way, when the short optical fiber (an optical fiber whose clad diameter is small) is structured so as to be able to be attached to and removed from the multi-mode optical fiber 132 by using an optical connector or the like, if the optical fiber whose clad diameter is small breaks or the like, replacement of these portions is easy, and therefore, the costs required for maintaining the exposure head 100 can be reduced. Note that, in the following description, there will be cases in which the optical fiber 134 will be called the light exiting end portion of the multi-mode optical fiber 132.

Figure 16:
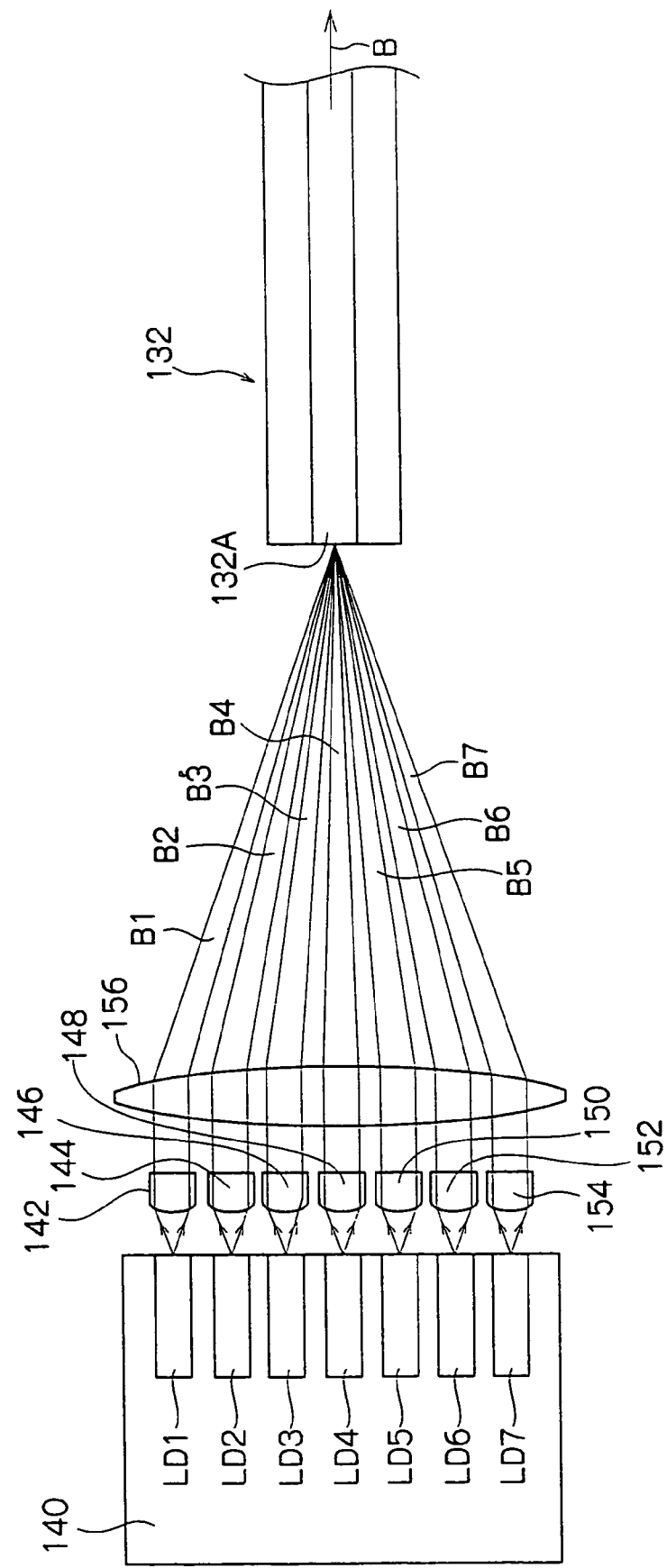
FIG. 16 is a schematic plan view showing the structure of a multiplex laser light source.

The laser module 130 is structured by the multiplex laser light source (fiber light source) shown in FIG. 16. This multiplex laser light source is structured by a plurality (e.g., seven) chip-like transverse multi-mode or single-node UV semiconductor lasers LD1, LD2, LD3, LD4, LD5, LD6, LD7 which are fixed so as to be lined-up on a heat block 140; collimator lenses 142, 144, 146, 148, 150, 152, 154 which are provided so as to correspond respectively to the UV semiconductor lasers LD1 through LD7; a single condenser lens 156; and the single multi-node optical fiber 132. Namely, the light condensing optical system is structured by the collimator lenses 142 through 154 and the condenser lens 156, and the multiplex optical system is structured by this light condensing optical system and the multi-mode optical fiber 132.

Accordingly, at the exposure head 100, each of laser beams B1, B2, B3, B4, B5, B6, B7, which are emitted as scattered light from the respective UV semiconductor lasers LD1 through LD7 structuring the multiplex light source of the fiber array light source 112, is first transformed into parallel rays by the corresponding collimator lens 142 through 154. Then, the laser beams B1 through B7 which have been made into parallel rays are collected by the condenser lens 156, and are converged at the light incident end surface of the core 132A of the multi-mode optical fiber 132.

The laser beams B1 through B7, which have been converged at the light incident end surface of the core 132A of the multi-mode optical fiber 132, are incident at the core 132A and propagate through the interior of the optical fiber, and are multiplexed into a single laser beam B. The oscillation wavelengths and maximum outputs of the UV semiconductor lasers LD1 through LD7 are all the same. Given that the coupling efficiency at this time is, for example, 85%, in a case in which the output of each of the UV semiconductor lasers LD1 through LD7 is 30 mW, a multiplex laser beam B having an output of about 180 mW (=30 mW×0.85× 7) can be obtained.

In this way, the multiplex laser beam B exits from the optical fiber 134 which is coupled to the light exiting end portion of the multi-mode optical fiber 132. For example, as shown in FIGS. 12 and 14C, in the case of the laser exiting portion 114 in which six of the optical fibers 134 are lined-up in an array (high-intensity light-emitting points are lined-up in one row along the main scanning direction), the output is a high output of about 1 W (=180 mW×6). Note that the number of UV semiconductor lasers structuring the multiplex laser light source is not limited to seven.

Figure 17:
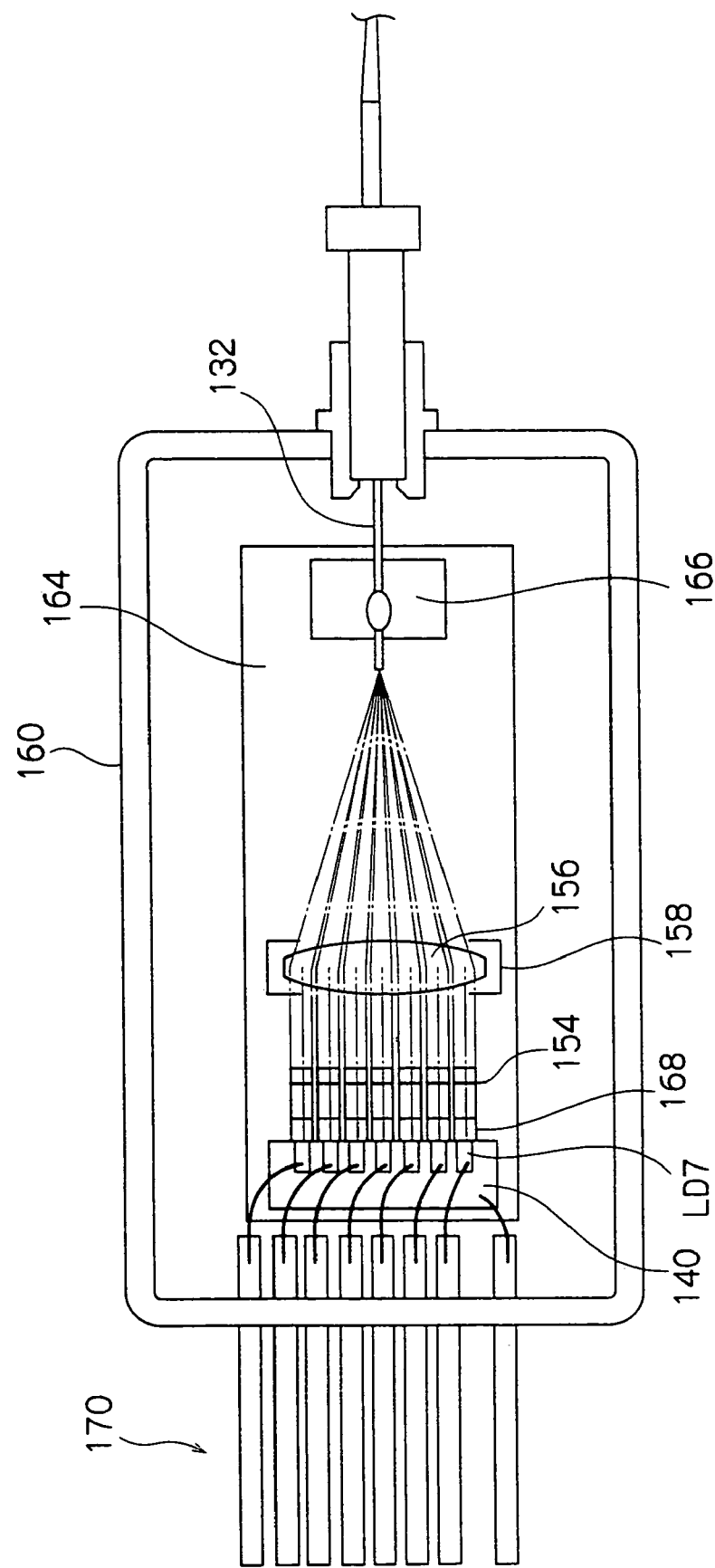
FIG. 17 is a schematic plan view showing the structure of a laser module.
Figure 18:
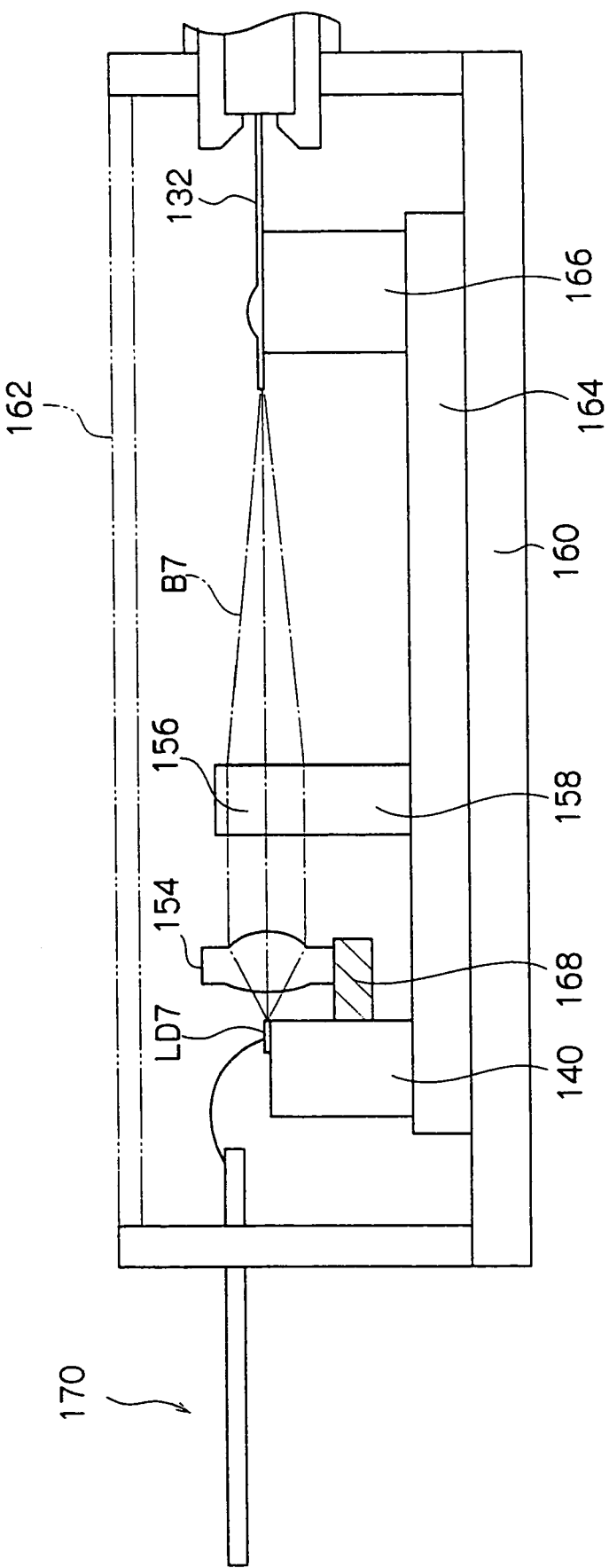
FIG. 18 is a schematic side view showing the structure of the laser module.

As shown in FIGS. 17 and 18, the above-described multiplex laser light source (UV semiconductor lasers) is housed, together with other optical elements, within a package 160 which is shaped as a box and whose top is open. The package 160 has a package cover 162 which can close this opening. After deaerating processing is carried out, sealing gas is filled in, and the opening of the package 160 is closed by the package cover 162. In this way, the above-described multiplex laser light source is sealed airtight within the closed space (sealed space) formed by the package 160 and the package cover 162.

A base plate 164 is fixed to the floor surface of the package 160. The heat block 140, a condenser lens holder 158 which holds the condenser lens 156, and a fiber holder 166 which holds the light incident end portion of the multi-mode optical fiber 132, are mounted to the top surface of the base plate 164. The light exiting end portion of the multi-mode optical fiber 132 is pulled out to the exterior of the package 160 from an opening formed in a wall surface of the package 160.

A collimator lens holder 168 is mounted to a side surface of the heat block 140, and the collimator lenses 142 through 154 are held thereat. An opening is formed in a side wall surface of the package 160, and wiring 170, which supplies driving electric current to the UV semiconductor lasers LD1 through LD7, is led-out through this opening to the exterior of the package 160. Note that, in FIGS. 17 and 18, in order to avoid complicating the drawing, a reference numeral is shown for only the UV semiconductor laser LD7 among the plural UV semiconductor lasers, and a reference numeral is shown for only the collimator lens 154 among the plural collimator lenses.

Figure 19:
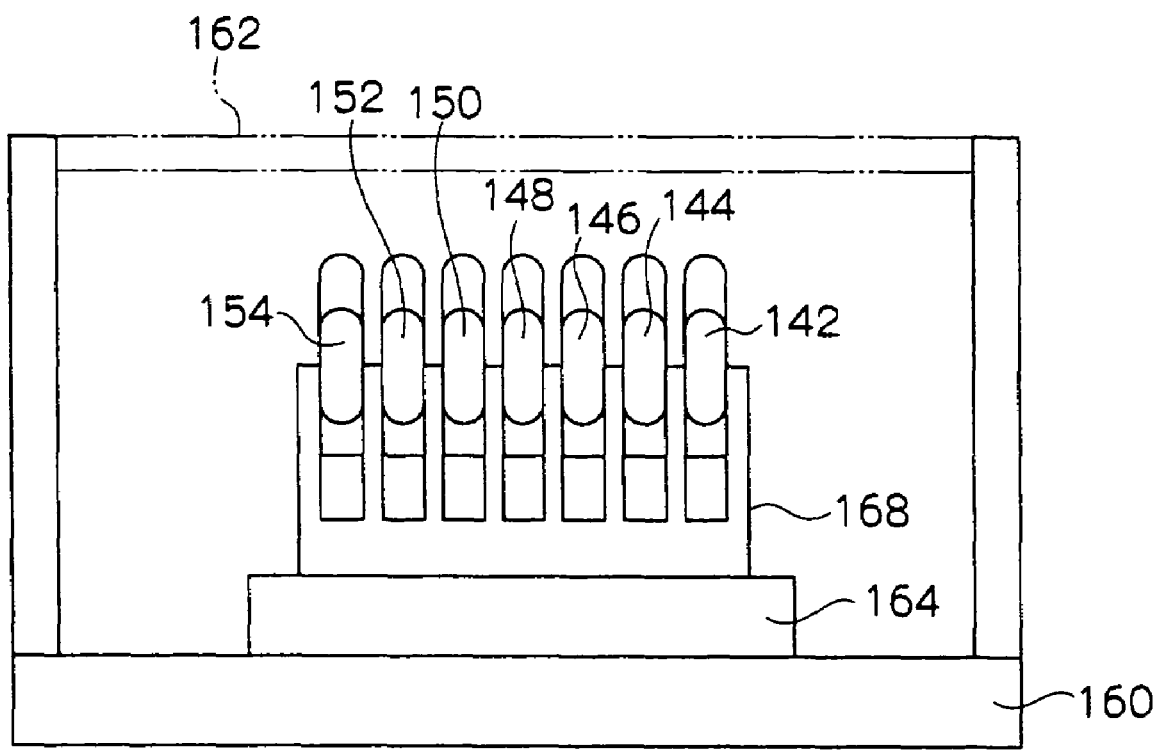
FIG. 19 is a schematic front view showing the structure of the laser module.

The configuration, in front view, of the mounting portions of the collimator lenses 142 through 154 is shown in FIG. 19. Each collimator lens 142 through 154 is formed in a configuration such that a region, which includes the optical axis of a circular lens having an aspherical surface, is cut out along parallel planes so as to have a long and narrow shape. These long, narrow collimator lenses 142 through 154 can be obtained by molding, for example, resin or optical glass. The collimator lenses 142 through 154 are disposed so as to tightly contact one another in the direction in which the light-emitting points of the UV semiconductor lasers LD1 through LD7 are lined-up (the left-right direction in the figure), and such that the lengthwise directions (longitudinal directions) of the collimator lenses 142 through 154 are orthogonal to the direction in which the light-emitting points are lined-up.

Lasers, which have active layers of light-emitting widths of 2 μm and which emit the respective laser beams B1 through B7 in a state in which the spread angles in the direction parallel to the active layer and the direction orthogonal to the active layer are, for example, 10° and 30° respectively, are used as the UV semiconductor lasers LD1 through LD7. These UV semiconductor lasers LD1 through LD7 are disposed such that the light-emitting points thereof are lined-up in one row in the direction parallel to the active layers. Accordingly, the laser beams B1 through B7 emitted from the respective light-emitting points are incident on the respective collimator lenses 142 through 154 which are long and narrow, in a state in which the directions in which the spread angles are large (larger) coincide with the lengthwise directions, and the directions in which the spread angles are small (smaller) coincide with the widthwise directions (the directions orthogonal to the lengthwise directions).

The condenser lens 156 is formed in a configuration which is long in the direction in which the collimator lenses 142 through 154 are lined-up (i.e., the horizontal direction) and is short in the direction orthogonal thereto, by a region, which includes the optical axis of a circular lens having an aspherical surface, being cut-out along parallel planes so as to have a long and narrow shape. The condenser lens 156 also can be obtained by molding resin or optical glass for example.

[Structure of Image Position Detecting Device]

Next, the structure of the image position detecting device 180 will be described with reference to FIG. 2. As described above, the image position detecting device 180 is structured so as to include, at the gate 18 which spans across the transverse direction of the laser exposure device 10, the CCD camera 182 which is mounted so as to be able to move freely along the transverse direction, and an unillustrated alignment control section. The CCD camera 182 includes two-dimensional CCDs as image pick-up elements, and has, as the light source at the time of image-pickup, a flash which, each time it emits light, emits light over an extremely short period of time. The light-receiving sensitivity of each CCD element is set so as to be able to pick-up an image only at the time when the flash emits light. The alignment control section processes the image signal from the CCD camera 182, and outputs, to the aforementioned controller, position information corresponding to the positions of alignment marks 203(see FIG. 7) picked-up by the CCD camera 182.

The CCD camera 182 is held at a holder 184 in a state of being directed downward. The holder 184 is movably supported at a guide plate 186 disposed parallel to the gate 18 beneath the gate 18. Accordingly, the CCD camera 182 can move reciprocatingly in the transverse direction along the guide plate 186, so as to be able to pick-up different regions of the substrate material 200. Namely, it is possible to adjust the position of the CCD camera 182 in accordance with, for example, the positions of the alignment marks 203 formed on the substrate material 200 which is the object of pick-up. Note that the CCD camera 182 is not limited to the illustrated one CCD camera, and plural CCD cameras may be provided and fixed at appropriate positions.

On the other hand, the image-drawing region 204 (see FIG. 7), at which the latent image corresponding to the wiring pattern is to be formed, is set in advance on the exposure surface 202 of the substrate material 200. Alignment marks 203 corresponding to this image-drawing region 204 are formed at the four corners. When the substrate material 200, which is sucked to and held at the stage member 20 and is being conveyed in at a predetermined speed, passes by the pick-up position (reading position) directly beneath the CCD camera 182, the CCD camera 182 makes the flash emit light at a predetermined timing, and receives the reflected light from the light of the flash. In this way, pick-up ranges, including the alignment marks 203, of the substrate material 200 are respectively picked-up.

The alignment marks 203 are formed by provided circular through-holes or recesses in the exposure surface 202 of the substrate material 200. The position (image-drawing region) of the substrate material 200 on the stage member 20 can thereby be detected. Note that, lands or the like, which are wiring patterns formed in advance on the exposure surface 202 of the substrate material 200, may be used for the alignment marks 203 rather than through-holes or recesses.

[Structure of Stage Members and Circulating Mechanisms]

Next, the structure of the stage members 20, 30 and the circulating mechanisms thereof will be described in detail on the basis of FIGS. 1 through 5. The stage members 20, 30 are formed in substantial L shapes as seen in side view, whose horizontal direction dimensions are longer than their vertical direction dimensions, by stage main bodies 22, 32 and guide walls 24, 34. The top surfaces of the stage main bodies 22, 32 are the planar placement surfaces 22A, 32A for placement of the substrate material 200. The guide walls 24, 34 stand erect integrally and upwardly at the outer side end portions of the stage main bodies 22, 32.

Pairs of rails 26, 36 project at the outer side end surfaces of the guide walls 24, 34. Guide grooves, which are formed in substantially upside-down U shapes as seen in sectional view, are formed in the rails 26, 36 along the vertical direction and over the entire lengths thereof. The interiors of the stage main bodies 22, 32 are hollow. A large number of small holes 22B, 32B for air suction, which are for sucking the substrate material 200 by vacuum, are formed in the placement surfaces 22A, 32A. Accordingly, cable bears (not illustrated) having power source lines or air pipes for generating a vacuum, are connected to stage members 20, 30.

Namely, when the stage members 20, 30 have vacuum generating devices (not illustrated) such as vacuum pumps for air suction or the like, cable bears having power source lines for driving the vacuum generating devices are used. When the stage members 20, 30 do not have vacuum generating devices, cable bears having air pipes connected to vacuum generating devices (not illustrated), such as vacuum pumps which are provided separately, are used. Note that it is preferable that the cable bears be structured by flexible tubes or the like so as to be able to follow the movement of the stage members 20, 30. However, because the linear traveling bodies 40, 60, which integrally support the stage members 20, 30, merely move reciprocatingly in the conveying direction and the returning direction on the same plane, the structures for mounting the cable bears to the stage members 20, 30 are simple, and problems such as the cable bears entwining do not arise.

The linear traveling bodies 40, 60 are formed in substantial L shapes as seen in side view, whose vertical direction dimensions are longer than their horizontal direction dimensions, by floor plates 42, 62 and guide walls 44, 64 which stand erect integrally and upwardly at the outer side end portions of the floor plates 42, 62. Pairs of guide rails 46, 66 project at both end portions of the inner surfaces of the guide walls 44, 64, along the vertical direction and over the entire lengths thereof. The guide grooves slidingly fit-together with the guide rails 46, 66, such that the stage members 20, 30 are supported integrally in a cantilevered manner by the linear traveling bodies 40, 60, respectively.

Ball screws 48, 68 are disposed parallel between the guide rails 46, 66. Motors (not illustrated), which can rotate the ball screws 48, 68 forward and reversely, are mounted to ones of end portions (e.g., the lower end portions) of the ball screws 48, 68. On the other hand, tubular members 28, 38, which have screw threads at the interiors thereof, project integrally along the vertical direction, from between the rails 26, 36 of the guide walls 24, 34. The ball screws 48, 68 are inserted through the tubular members 28, 38 in states of being screwed together therewith. Accordingly, due to the motors (not illustrated) being driven to rotate forward and reversely, the guide walls 24, 34, i.e., the stage members 20, 30, freely rise and fall along the guide rails 46, 66 of the guide walls 44, 64.

Rails 52, 72 project integrally at the bottom surfaces of the floor plates 42, 62 in vicinities of the four corners thereof. Guide grooves, which are formed in substantially upside-down U shapes as seen in sectional view, are formed in the rails 52, 72 along the conveying direction. The guide grooves are slidably fit together with pairs of guide rails 54, 74 which project from the top surface of the plate-shaped base 12 which has a predetermined thickness. As illustrated, the guide rails 54, 74 are provided as two sets lined-up adjacent to one another at predetermined positions on the base 12 along the conveying direction (returning direction) and over substantially the entire length. Ball screws 56, 76 are disposed parallel over a predetermined length between (i.e., at the inner sides of) the guide rails 54, 74, respectively. Vicinities of the both end portions of the ball screws 56, 76 are supported by pairs of supporting portions (not illustrated). Motors 50, 70 which can rotate forward and reversely are mounted to the upstream side end portions (or may be mounted to the downstream side end portions) of the ball screws 56, 76.

On the other hand, tubular members (not illustrated), which have screw threads at the interiors thereof, project integrally along the conveying direction (the returning direction) at the substantially central portions of the bottom surfaces of the floor plates 42, 62. The ball screws 56, 76 are inserted through these tubular members in states of being screwed together therewith. Accordingly, due to the motors 50, 70 being driven to rotate forward and reversely, the linear traveling bodies 40, 60 can move so as to be able to approach one another and then move away from one another (i.e., so as to be able to pass by one another) at a predetermined speed (e.g., 30 mm/s at the time of exposure) in the conveying direction and the returning direction along the guide rails 54, 74. Note that the motors 50, 70 are structured so as to be independently driven to rotate by driving pulse signals which are outputted from an unillustrated conveying control section, and this conveying control section is connected to the aforementioned controller. Further, the mechanisms for making the linear traveling bodies 40, 60 travel is not limited to the illustrated ball screws 56, 76 and the like, and the linear traveling bodies 40, 60 may be made to travel by linear motors or the like.

As illustrated, the linear traveling bodies 40, 60 move in the conveying direction and the returning direction in states in which the stage member 20, 30, which are supported in a cantilevered manner, oppose one another. As described above, the transverse direction lengths of the stage main bodies 22, 32 are formed to be longer than the transverse direction lengths of the floor plates 42, 62 (i.e., both of the stage main bodies 22, 32 of the stage members 20, 30 jut out toward the inner side, and in plan view, move within the same area). Accordingly, when the linear traveling bodies 40, 60 pass by each other, the stage members 20, 30 move while offset from one another at an upper position and a lower position so that the stage main bodies 22, 32 do not interfere with one another.

Namely, when alignment processing by the CCD camera 182 and exposure processing by the exposure heads 100 are being carried out, because the substrate materials 200 are placed on the placement surfaces 22A, 32A, the stage members 20, 30 move in the conveying direction at their upper positions. When the stage members 20, 30 move so as to return from the removing positions to the loading positions, because the substrate materials 200 have been removed from the placement surfaces 22A, 32A, the stage members 20, 30 move in the returning direction at their lower positions. In this way, when the laser exposure device 10 is structured such that the stage members 20, 30 move upward and downward and interference therebetween is avoided, there is the advantage that the transverse direction dimension of the laser exposure device 10 can be made to be compact (the space required for placement of the laser exposure device 10 can be reduced).

After the stage member 20, 30 has been raised to its upper position in this way, when alignment processing by the CCD camera 182 is carried out, the positional offset of the substrate material 200 at the time when the stage member 20, 30 is raised up can be corrected at the time of measuring by the CCD camera 182. Accordingly, registration with respect to the image-drawing region 204 can be carried out with high accuracy.

Because the exposure processing by the exposure heads 100 is carried out with the stage member 20, 30 raised to its upper position, the focal length between the exposure heads 100 and the exposure surface 202 of the substrate material 200 can be adjusted in accordance with the thickness of the substrate material 200. Namely, the amount by which the stage member 20, 30 is raised and lowered can be adjusted such that the distance between the exposure heads 100 and the exposure surface 202 of the substrate material 200 is constant, regardless of the thickness of the substrate material 200. Therefore, there is no need for focal length adjustment to change the heightwise position of attachment of the exposure heads 100, for each substrate material 200 of a different thickness. Moreover, because the stage members 20, 30 always travel integrally with the linear traveling bodies 40, 60, this movement can be carried out highly accurately and stably.

[Operation of Exposure Device]

Next, the series of operations of the laser exposure device 10 having the above-described structure will be described mainly with reference to FIGS. 1, 4 and 5. First, the substrate material 200A, which has been successively supplied in by a supplying conveyor 86, is stopped and positioned by unillustrated stoppers, and the four corners thereof are sucked by suction members 82 of the loader 80. The suction members 82 are supported by a guide plate 84 so as to be movable in the conveying direction and the returning direction. The substrate material 200A is conveyed from the supplying conveyor 86 and loaded on the placement surface 22A of the stage member 20 which is standing-by at its initial position (loading position).

At this time, negative pressure is being supplied by a vacuum pump or the like to the stage member 20 via the cable bear. Therefore, air is sucked in from the large number of small holes 22B formed in the placement surface 22A, and due to the working thereof, the substrate material 200A is fixed to the placement surface 22A in a state of being fit tightly thereon. Then, the stage member 20 is raised to a predetermined position. The upper position at this time is adjusted appropriately in accordance with the thickness of the substrate material 200A.

When the substrate material 200A is sucked and held on the placement surface 22A of the stage member 20 and is held at the upper position in this way, the motor 50 is driven by a driving pulse signal from the conveying control section, and the ball screw 56 rotates. Thus, the linear traveling body 40 moves at a predetermined speed in the conveying direction along the guide rails 54. First, the alignment marks 203 provided at the four corners of the substrate material 200A are picked-up by the CCD camera 182 mounted to the gate 18, and the position of the image-drawing region 204 of the substrate material 200A is detected.

Namely, when the alignment marks 203 of the substrate material 200A reach the pick-up position (the reading position) of the CCD camera 182, the flash is made to emit light, and the pick-up region including the alignment marks 203 at the exposure surface 202 is picked-up by the CCD camera 182. Then, the picked-up information obtained by the CCD camera 182 is outputted to the alignment control section. The alignment control section converts the picked-up information into position information corresponding to the positions of the alignment marks 203 along the scanning direction and the transverse direction, and outputs this position information to the controller.

On the basis of the position information of the alignment marks 203 from the alignment control section, the controller judges the positions of the alignment marks 203 which are provided in correspondence with the image-drawing region 204. From the positions of the alignment marks 203, the controller judges the position of the image-drawing region 204 along the scanning direction and the transverse direction, and the amount by which the image-drawing region 204 is inclined with respect to the scanning direction. Namely, the controller judges the position of the substrate material 200A on the stage member 20, and on the basis of the image information, judges the positions of the alignment marks 203 on the substrate material 200A, and judges the image-drawing region 204.

Then, on the basis of the position of the image-drawing region 204 along the scanning direction, the controller computes the timing for the start of exposure of the image-drawing region 204. On the basis of the position of the image-drawing region 204 along the transverse direction and the amount of inclination with respect to the scanning direction, the controller carries out conversion processing on the image information corresponding to the wiring pattern, and stores the image information, which has been subjected to the conversion processing, in a frame memory.

Here, the conversion processing includes coordinate conversion processing which rotates the image information around the origin of the coordinate, and coordinate conversion processing which moves, in parallel, the image information along the coordinate axis corresponding to the transverse direction. If needed, the controller further carries out conversion processing for expanding or contracting (reducing) the image information in correspondence with the amount of expansion or the amount of contraction of the image-drawing region 204 along the transverse direction and the scanning direction.

The image information after the conversion processing which has been obtained in this way and the position information of the image-drawing region 204 are temporarily stored in the frame memory of the controller in relation to the stage member 20. After the substrate material 200A has been fed out from the stage member 20 (from the laser exposure device 10) to an unillustrated conveying device for conveying to the subsequent process, the information is deleted from the frame memory. Note that the alignment processing time in the present embodiment is 15 seconds.

Due to the stage member 20 (the linear traveling body 40) moving further in the conveying direction, the substrate material 200A, whose alignment marks 203 have been picked-up, is supplied to the exposure position of the exposure heads 100 which are suspended at the gate 16. While moving at a predetermined speed (e.g., 30 mm/s), the image-drawing region 204, whose position has been detected by the alignment control section on the basis of the pick-up by the CCD camera 182, is exposed on the basis of the image information corresponding to the wiring pattern, such that a latent image (an image) of the wiring pattern and the like is formed on the image-drawing region 204 of the substrate material 200A. Namely, due to the substrate material 200A being moved in the conveying direction together with the stage member 20, the exposure heads 100 are subscanned relatively in the returning direction. Therefore, the strip-shaped exposed regions 206 (see FIGS. 7 and 8) are successively formed on the substrate material 200A by the respective exposure heads 100.

Here, to explain this exposure processing step more concretely, first, the controller judges the position of the substrate material 200A on the stage member 20. On the basis of the position information of the image-drawing region 204 stored in the frame memory, the controller determines the timing at which the leading end of the image-drawing region 204 will reach the exposure position. Then, the controller outputs an exposure start signal to the image information processing section synchronously with the timing at which the leading end of the image-drawing region 204 reaches the exposure position. In this way, the image information processing section successively reads out, in units of plural lines (i.e., plural lines-by-plural lines), the image information stored in the frame memory, and on the basis of the read-out image information, generates a control signal for each of the exposure heads 100. Then, on the basis of the generated control signals, the mirror driving control section controls each micromirror 110 of the DMD 106 of each exposure head 100 to be set in an on state or in an off state.

When the micromirrors 110 of the DMD 106 are controlled on and off in this way, laser light is illuminated from the fiber array light source 112 to the DMD 106. The laser light reflected by the micromirrors 110 which are in an on state is imaged on the exposure surface 202 of the substrate material 200A by the lens systems 122, 124. Namely, the laser light exiting from the fiber array light source 112 is turned on or off on a pixel-by-pixel basis, and the image-drawing region 204 of the substrate material 200A is exposed in pixel units (exposure areas) of substantially the same number as the number of pixels used at the DMD 106. Note that the term "image information" used here refers to data binarily expressing (i.e., expressing by the absence/presence of recording of a dot) the density of each pixel forming the image. The exposure processing time by the exposure heads 100 in the present embodiment is 15 seconds.

On the other hand, the stage member 30 is operated to return, while the substrate material 200A on the stage member 20 is subjected to alignment processing and until the exposure processing is started. Namely, the stage member 30 is lowered to its lower position, and the linear traveling body 60 moves at a predetermined speed along the guide rails 74 from the removal position to the loading position. Then, while the exposure processing of the stage member 20 is being carried out, the next substrate material 200B is conveyed from the supplying conveyor 86 and loaded onto the placement surface 32A at the loading position by the loader 80. At this time, in the same way as described above, the substrate material 200B is sucked and held on the placement surface 32A due to the working of the vacuum caused by air being sucked in from the small holes 32B of the stage member 30.

When the substrate material 200B is loaded in this way, the stage member 30 is raised to its upper position. The motor 70 is driven by a driving pulse signal from the conveying control section, and the ball screw 76 is rotated. Thus, the linear traveling body 60 moves at a predetermined speed in the conveying direction along the guide rails 74. The alignment marks 203 provided at the four corners of the substrate material 200B are picked-up by the CCD camera 182 mounted to the gate 18, and the position of the image-drawing region 204 on the substrate material 200B is detected. Namely, in the 15 seconds from the start to the end of exposure at the stage member 20, the processes from the loading of the substrate material 200B onto the stage member 30 up to now are substantially completed.

On the other hand, when exposure of the substrate material 200A is completed, the stage member 20 is lowered to its lower position, the negative pressure generated by the vacuum pump or the like is cancelled, and the substrate material (the printed circuit board) 200A is removed from the placement surface 22A by the unloader 90. Namely, the four corners of the substrate material 200A are sucked by suction members 92 of the unloader 90, and the substrate material 200A is conveyed along a guide plate 94 from the stage member 20 onto a discharge conveyor 96. Then, the substrate material (the printed circuit board) 200A is conveyed by an unillustrated conveying device to the subsequent process.

Due to the motor 50 driving the ball screw 56 to rotate in the direction opposite to that at the time of conveying, the stage member 20 (the linear traveling body 40) from which the substrate material 200A has been removed is moved to return to the original loading position (the initial position). Then, the next substrate material 200A is loaded onto the placement surface 22A by the loader 80. Note that, at this time, the alignment marks 203 of the substrate material 200B loaded on the stage member 30 have already been picked-up by the CCD camera 182, and the position of the image-drawing region 204 thereof has been detected and exposure has started. Namely, when exposure of the image-drawing region 204 of the substrate material 200A is completed, the controller, in the same way as in the case of this image-drawing region 204, carries out exposure on the image-drawing region 204 of the next substrate material 200B on the basis of the converted image information and the position information.

Then, when exposure of the substrate material 200B sucked and held on the stage member 30 is completed, the stage member 30 is lowered to its lower position, the negative pressure generated by the vacuum pump or the like is cancelled, and the substrate material (printed circuit board) 200B is removed from the placement surface 32A by the unloader 90. This state is shown in FIG. 4. Then, the stage member 20, on which the new substrate material 200A has been loaded at the loading position, repeats the above-described operations. The stage member 30 (the linear traveling body 60) from which the substrate material has been removed also returns by the same processes as the stage member 20. The next substrate material (not illustrated) is loaded on the placement surface 32A thereof, and the above-described operations are repeated.

In this way, the laser exposure device 10 carries out exposure processing without pause (without time intervals between exposure processings), and the operation rate of the exposure heads 100 is improved. Accordingly, the efficiency of manufacturing printed circuit boards can be improved. By the way, in the case of a conventional laser exposure device which carries out exposure processing while a single stage member is moved reciprocatingly (moved horizontally) at the same heightwise position (in the same plane), the manufacturing tact thereof (the tact time) is 30 seconds. However, in the case of the laser exposure device 10 relating to the present invention which carries out exposure processing while alternately circulating two stage members, the manufacturing tact is 24 seconds. Namely, the manufacturing tact of printed circuit boards is reduced to ⅘ of that of the conventional art.

Figure 4:
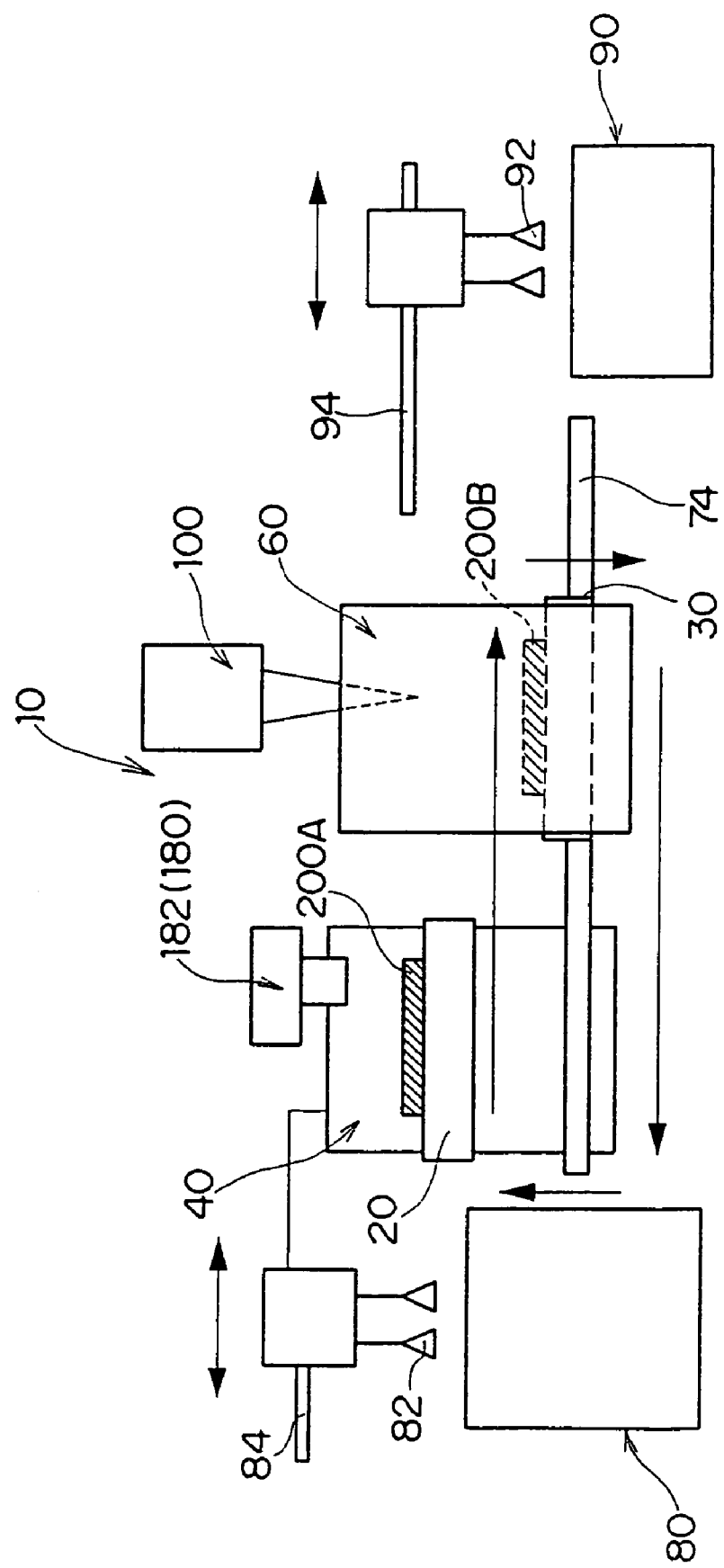
FIG. 4 is a schematic diagram showing a process of the laser exposure device relating to the present invention.
Figure 5:
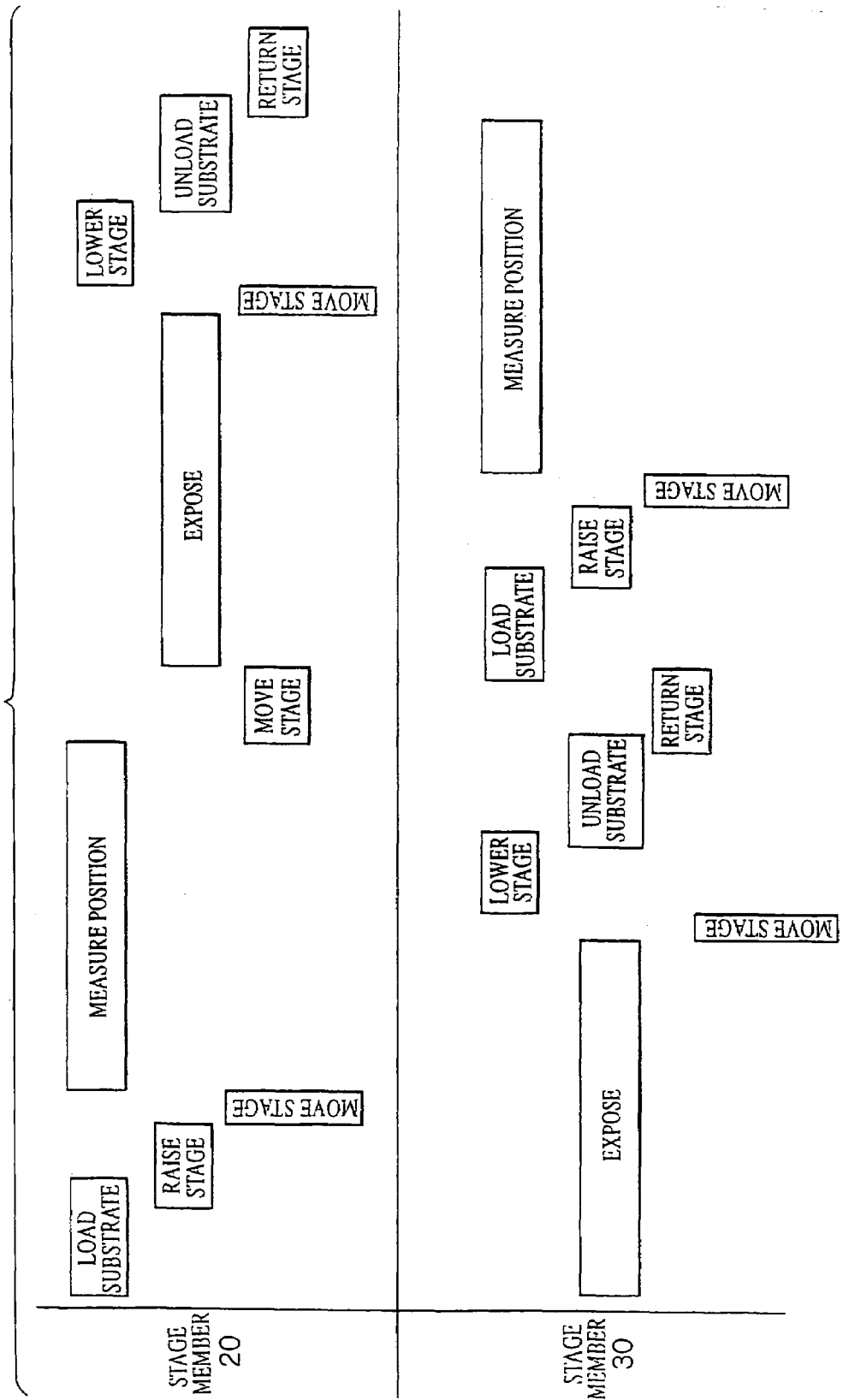
FIG. 5 is a diagram for explanation of the tact of the laser exposure device relating to the present invention.
Figure 6:
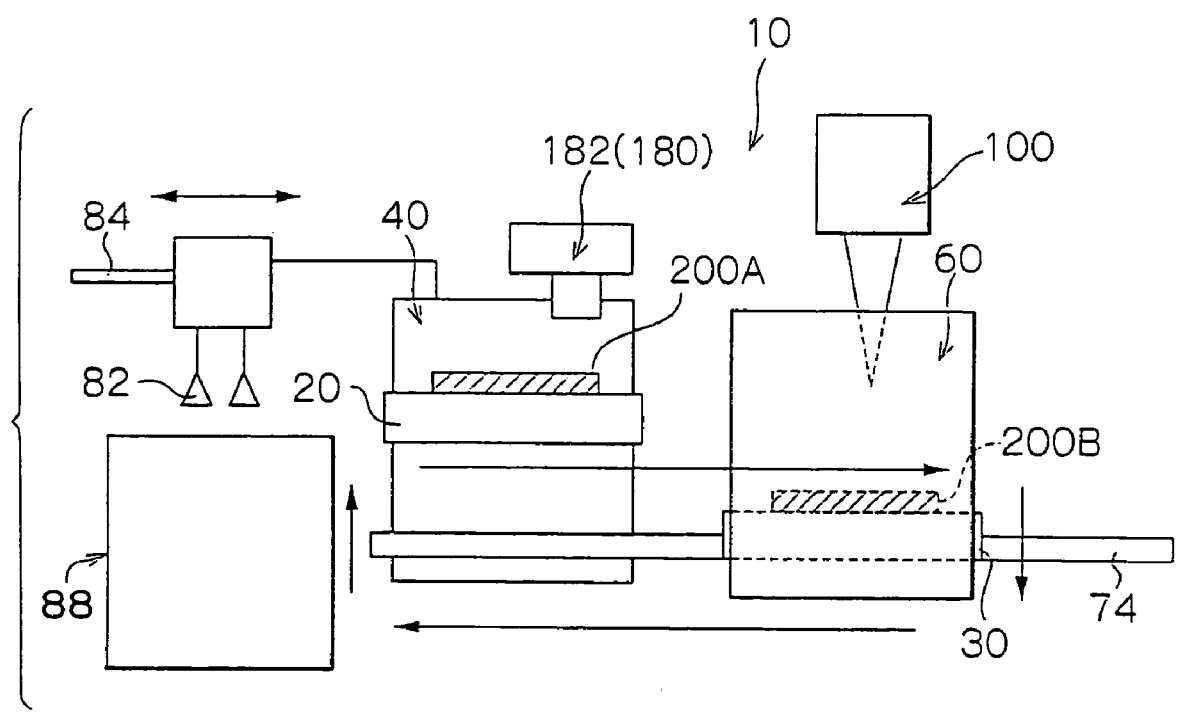
FIG. 6 is a schematic diagram showing another process of the laser exposure device relating to the present invention.

The laser exposure device shown in FIG. 4 is structured such that the loader 80 and the unloader 90 are provided, and the loading position and the removal position of the substrate materials 200 are different positions. However, the loader 80 and the unloader 90 may be disposed at substantially the same position, or, as shown in FIG. 6, loading and removal of the substrate materials 200 may be carried out at substantially the same position by a conveying-in/conveying-out device 88 in which the loader 80 and the unloader 90 are integral. With such a structure, the placement space can be reduced by the amount of space occupied by the unloader 90 (or the loader 80), and in a case in which the loading and unloading of the substrate materials 200 is carried out manually, it suffices for there to be only one person as an operator, and the work involved can be made to be very convenient.

The linear moving bodies 40, 60 are supported by the individual guide rails 54, 74 so as to be able to travel via the rails 52, 72, so as to reciprocatingly move the placement surfaces 22A, 32A of the stage members 20, 30 along substantially the same locus (i.e., such that the placement surfaces 22A, 32A move in substantially the same area). Further, the stage members 20, 30 are disposed so as to have plane symmetry, and the linear moving bodies 40, 60 are disposed so as to have plane symmetry. Therefore, the laser exposure device 10 is well-balanced in the widthwise direction (the left-right direction), and the stage members 20, 30 can move stably and precisely by the linear traveling bodies 40, 60.

Further, the linear traveling bodies 40, 60 have the floor plates 42, 62 which move the stage members 20, 30 in directions parallel to the placement surfaces 22A, 32A thereof, and the guide walls 44, 64 which move the stage members 20, 30 in the perpendicular direction. Therefore, the stage members 20, 30 are suitably supported. In addition, the motors 50, 70 which drive the linear traveling bodies 40, 60 are independently controlled by the conveying control section. Thus, even if there is trouble with one of the motors 50, 70, the other is not affected. Namely, even if there is trouble with one, the other can be operated, and thus, exposure processing of the substrate materials 200 can be carried out continuously.

The linear traveling bodies 40, 60 are disposed such that the floor plates 42, 62 thereof are lined up (are parallel), and the placement surfaces 22A, 32A of the stage members 20, 30 are disposed so as to be superposed above (i.e., so as to move within substantially the same area as) the floor plates 42, 62 as seen in plan view. Therefore, the laser exposure device 10 itself can be made to be compact. Namely, in setting the laser exposure device 10, space can be conserved especially in the transverse direction.

Further, rather than the stage members 20, 30 being moved up and down and interference therebetween being avoided, the stage members 20, 30 may be structured so as to be able to move circulatingly by being moved in the horizontal direction. Namely, a structure is possible such that, when the stage members 20, 30 are returning, they move along routes which detour around at the outer sides of the side walls 14. In this case, the base 12 must be extended in the transverse direction of the laser exposure device 10, and guide rails and the like for such detouring must be provided. Therefore, much space is required for placement in the transverse direction, but the placement space in the vertical direction is reduced.

In the above embodiment, description is given of the laser exposure device 10, which exposes the substrate materials 200 as materials of printed circuit boards, as an example of the image forming device relating to the present invention. However, the image forming device relating to the present invention is not limited to the laser exposure device 10 which exposes substrate materials 200, and can also be applied to exposure devices and the like which expose photosensitive materials such as photosensitive printing plates like PS plates, CT printing plates, and the like, or photosensitive papers, or the like. Further, other than laser beams, visible light rays, X rays, or the like can be used as the light beams for exposing these materials. Moreover, the image forming device relating to the present invention can also be applied to inkjet-type image forming devices and display manufacturing devices.

In accordance with the present invention, it is possible to efficiently carry out image forming processing for forming an image on a recording medium, while moving the recording medium. Accordingly, the manufacturing efficiency can be improved.

What is claimed is:

1. An image forming device forming images on recording media which are conveyed from a loading position, at which the image forming device receives the recording medium, to a removal position, at which the image recording medium is removed to a subsequent process, the image forming device comprising:

two traveling bodies moving reciprocatingly between the loading position and the removal position;

an image forming section for forming images on the recording media at a predetermined position between the loading position and the removal position;

stage members on which the recording media are loaded, each stage member being mounted to a corresponding traveling body; and an interference preventing mechanism for avoiding interference between the stage members when the two traveling bodies move so as to approach one another.

2. The image forming device of claim 1, wherein the loading position and the removal position are fixed positions.

3. The image forming device of claim 1, wherein the interference preventing mechanism includes a stage member moving mechanism which moves at least one of the stage members on the traveling body on which that stage member is mounted.

4. The image forming device of claim 1, wherein the two traveling bodies move along different conveying paths which extend parallel to one another and connect the loading position and the removal position, and each stage member has a portion which juts out further than the corresponding traveling body.

5. The image forming device of claim 4, wherein the portion of each stage member which juts out further than the corresponding traveling body passes through a common region at a time of image formation.

6. The image forming device of claim 5, wherein the interference preventing mechanism has a moving mechanism which, in the common region, moves the stage members on the traveling bodies to which the stage members are mounted, such that a distance from a recording surface of the recording medium to the image forming section is constant.

7. The image forming device of claim 1, wherein the interference preventing mechanism avoids interference by moving at least one of the stage members in vertical directions on the traveling body to which that stage member is mounted.

8. The image forming device of claim 1, wherein the interference preventing mechanism avoids interference by moving at least one of the stage members in horizontal directions on the traveling body to which that stage member is mounted.

9. The image forming device of claim 6, wherein the image forming section is a laser exposure device which illuminates laser light corresponding to an image signal.

10. The image forming device of claim 1, wherein the recording media are printed circuit boards.

11. An image forming device in which recording media are loaded onto stage members at a loading position, and images are formed on the recording media while the stage members pass through an image forming section, and the recording media on which the images have been formed are removed from the stage members at a removal position, the image forming device comprising:

two traveling bodies provided so as to move so as to be able to pass by one another, along conveying paths which connect the loading position and the removal position;

the stage members, each stage member provided at a corresponding traveling body so as to jut out from the corresponding traveling body; and an interference preventing mechanism avoiding interference between the stage members such that the stage members do not interfere with one another when the stage members pass by one another.

12. The image forming device of claim 11, wherein the interference preventing mechanism is a moving mechanism which makes the stage members approach the image forming section and makes the stage members move away from the image forming section.

13. The image forming device of claim 12, wherein the moving mechanism adjusts moving amounts of the stage members such that a distance between the image forming section and a recording surface of the recording medium is constant regardless of a thickness of the recording medium.

14. The image forming device of claim 11, wherein the loading position and the removal position are fixed positions.

15. The image forming device of claim 11, wherein the interference preventing mechanism includes a stage member moving mechanism which moves at least one of the stage members on the traveling body to which that stage member is mounted.

16. The image forming device of claim 11, wherein the two traveling bodies move along different conveying paths which extend parallel to one another and connect the loading position and the removal position.

17. The image forming device of claim 11, wherein a portion of each stage member which juts out further than the corresponding traveling body passes through a common region at a time of image formation.

18. The image forming device of claim 11, wherein the interference preventing mechanism avoids interference by moving at least one of the stage members in vertical directions on the traveling body to which that stage member is mounted.

19. The image forming device of claim 11, wherein the interference preventing mechanism avoids interference by moving at least one of the stage members in horizontal directions on the traveling body to which that stage member is mounted.

20. The image forming device of claim 11, wherein the image forming section is a laser exposure device which illuminates laser light corresponding to an image signal, and the recording media are printed circuit boards.

21. The image forming device of claim 11, wherein the loading position and the removal position are disposed at substantially the same position.

22. An image forming device comprising:

an image forming section for forming an image on a recording medium;

two stage members on which the recording media are loaded, and which are for conveying the recording media to the image forming section; and two moving mechanisms provided for the stage members respectively, and reciprocatingly moving at least stage surfaces of the stage members on substantially the same locus, between a loading position at which the recording medium is loaded on the stage member, and an image forming position at which an image is formed on the recording medium loaded on the stage member, and a removal position at which the recording medium is removed from the stage member, wherein each of the moving mechanisms has individual rails for moving which support the stage members respectively, and the loading position is distinct from the removal position.

23. The image forming device of claim 22, further comprising a control section for controlling the two moving mechanisms independently.

24. The image forming device of claim 22, wherein the two stage members are disposed so as to have plane symmetry with respect to one another, and the two moving mechanisms are disposed so as to have plane symmetry with respect to one another.

25. The image forming device of claim 22, wherein each of the moving mechanisms has a parallel moving portion moving the stage member in a direction parallel to the stage surface of the stage member, and a perpendicular moving portion moving the stage member in a direction perpendicular to the stage surface of the stage member.

26. The image forming device of claim 25, wherein the parallel moving portions of the moving mechanisms are disposed so as to be lined up, and the stage members are disposed such that the stage surfaces are superposed above the two parallel moving portions as seen in plan view.

27. An image forming device, the image forming device comprising:
- a loader, connected to a loading position of a body of the image forming device, which receives a recording media and automatically loads the recording media into the loading position of the body of the image forming device;
- an unloader, connected to a removing position of the body of the image forming device, which automatically removes the recording media from the removing position of the body of the image forming device;
- the body which forms an image on the recording medium, the body comprising two traveling bodies moving reciprocally between the loader and the unloader; and
- an interference preventing mechanism for avoiding interference between the two traveling bodies as the two traveling bodies approach one another,
- wherein the two traveling bodies each comprises a stage member on which the recording media is placed, and the loading position is distinct from the removing position.

* * * * *